US012763543B2

(12) United States Patent
Kishimoto et al.

(10) Patent No.: US 12,763,543 B2
(45) Date of Patent: Oct. 13, 2026

(54) LINE NARROWING LASER DEVICE, AND ELECTRONIC DEVICE MANUFACTURING METHOD

(71) Applicant: Gigaphoton Inc., Tochigi (JP)

(72) Inventors: Shigeto Kishimoto, Oyama (JP); Hirotaka Miyamoto, Oyama (JP); Motoki Niwano, Oyama (JP)

(73) Assignee: Gigaphoton Inc., Tochigi (JP)

( * ) Notice: Subject to any disclaimer, the term of this patent is extended or adjusted under 35 U.S.C. 154(b) by 127 days.

(21) Appl. No.: 18/807,533

(22) Filed: Aug. 16, 2024

(65) Prior Publication Data

US 2024/0413600 A1 Dec. 12, 2024

Related U.S. Application Data

(63) Continuation of application No. PCT/JP2022/013452, filed on Mar. 23, 2022.

(51) Int. Cl.
*G03F 7/20* (2006.01)
*G03F 7/00* (2006.01)
(Continued)

(52) U.S. Cl.
CPC .......... *H01S 3/106* (2013.01); *G03F 7/70025* (2013.01); *G03F 7/70041* (2013.01); *H01S 3/08009* (2013.01); *H01S 3/225* (2013.01)

(58) Field of Classification Search
CPC ...... H01S 3/106; H01S 3/08009; H01S 3/225; H01S 3/08004; H01S 3/0971;
(Continued)

(56) References Cited

U.S. PATENT DOCUMENTS

| | | | | |
|---|---|---|---|---|
| 4,963,806 A | 10/1990 | Shinohara et al. | | |
| 2002/0141464 A1* | 10/2002 | Bushida | H01S 3/139 | 372/32 |

(Continued)

FOREIGN PATENT DOCUMENTS

| | | | |
|---|---|---|---|
| JP | H05104421 A | 4/1993 | |
| JP | 2002287831 A | 10/2002 | |

(Continued)

OTHER PUBLICATIONS

International Search Report issued in PCT/JP2022/013452; mailed Jun. 7, 2022.

(Continued)

*Primary Examiner* — Mesfin T Asfaw
(74) *Attorney, Agent, or Firm* — Studebaker Brackett PLLC

(57) ABSTRACT

A line narrowing laser device includes an optical element and a diffractive optical element positioned on an optical path of an optical resonator, a wavelength actuator configured to change an incident angle of light incident on the diffractive optical element by moving the optical element, a wavelength driver configured to drive the wavelength actuator, a processor configured to output a wavelength control signal to the wavelength driver so that a wavelength of pulse laser light output from the optical resonator periodically changes, and a notch filter arranged in a path of the wavelength control signal and configured to operate at a notch frequency different from a drive frequency of the wavelength actuator.

20 Claims, 20 Drawing Sheets

(51) Int. Cl.
*H01S 3/08* (2023.01)
*H01S 3/106* (2006.01)
*H01S 3/225* (2006.01)

(58) Field of Classification Search
CPC .......... H01S 3/137; H01S 3/10; H01S 3/1055; H01S 5/141; G03F 7/70025; G03F 7/70041; G03F 7/70575
See application file for complete search history.

(56) References Cited

U.S. PATENT DOCUMENTS

| | | | |
|---|---|---|---|
| 2004/0190583 | A1 | 9/2004 | Tojo et al. |
| 2016/0352061 | A1 | 12/2016 | Resan |
| 2020/0358244 | A1 | 11/2020 | Li et al. |
| 2021/0294223 | A1 | 9/2021 | Yamanaka et al. |

FOREIGN PATENT DOCUMENTS

| | | | |
|---|---|---|---|
| JP | 2004266624 | A | 9/2004 |
| JP | 2004294938 | A | 10/2004 |
| JP | 2006276128 | A | 10/2006 |
| JP | 2015114677 | A | 6/2015 |
| JP | 2016225607 | A | 12/2016 |
| WO | 2020157839 | A1 | 8/2020 |

OTHER PUBLICATIONS

International Preliminary Report on Patentability (Chapter I) and Written Opinion of the International Searching Authority issued in PCT/JP2022/013452; issued Sep. 24, 2024.

* cited by examiner

18b

LINE NARROWING LASER DEVICE, AND ELECTRONIC DEVICE MANUFACTURING METHOD

CROSS-REFERENCE TO RELATED APPLICATIONS

The present application claims the benefit of International Application No. PCT/JP2022/013452, filed on Mar. 23, 2022, the entire contents of which are hereby incorporated by reference.

BACKGROUND

1. Technical Field

The present disclosure relates to a line narrowing laser device, and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser device for exposure, a KrF excimer laser device for outputting laser light having a wavelength of about 248 nm and an ArF excimer laser device for outputting laser light having a wavelength of about 193 nm are used.

The KrF excimer laser device and the ArF excimer laser device each have a large spectral line width of about 350 to 400 μm in natural oscillation light. Therefore, when a projection lens is formed of a material that transmits ultraviolet rays such as KrF laser light and ArF laser light, there is a case in which chromatic aberration occurs. As a result, the resolution may decrease. Then, a spectral line width of laser light output from the gas laser device needs to be narrowed to the extent that the chromatic aberration can be ignored. For this purpose, there is a case in which a line narrowing module (LNM) including a line narrowing element (etalon, grating, and the like) is provided in a laser resonator of the gas laser device to narrow a spectral line width. A gas laser device with a narrowed spectral line width is referred to as a line narrowing laser device.

LIST OF DOCUMENTS

Patent Documents

Patent Document 1: Japanese Patent Application No. 2006-276128

Patent Document 2: Japanese Patent Application No. 2004-266624

Patent Document 3: Japanese Patent Application No. H05-104421

Patent Document 4: U.S. Pat. No. 4,963,806

SUMMARY

A line narrowing laser device according to an aspect of the present disclosure includes an optical element and a diffractive optical element positioned on an optical path of an optical resonator, a wavelength actuator configured to change an incident angle of light incident on the diffractive optical element by moving the optical element, a wavelength driver configured to drive the wavelength actuator, a processor configured to output a wavelength control signal to the wavelength driver so that a wavelength of pulse laser light output from the optical resonator periodically changes, and a notch filter arranged in a path of the wavelength control signal and configured to operate at a notch frequency different from a drive frequency of the wavelength actuator.

An electronic device manufacturing method according to an aspect of the present disclosure includes generating pulse laser light using a line narrowing laser device, outputting the pulse laser light to an exposure apparatus, and exposing a photosensitive substrate to the pulse laser light in the exposure apparatus to manufacture an electronic device. Here, the line narrowing laser device includes an optical element and a diffractive optical element positioned on an optical path of an optical resonator, a wavelength actuator configured to change an incident angle of light incident on the diffractive optical element by moving the optical element, a wavelength driver configured to drive the wavelength actuator, a processor configured to output a wavelength control signal to the wavelength driver so that a wavelength of the pulse laser light output from the optical resonator periodically changes, and a notch filter arranged in a path of the wavelength control signal and configured to operate at a notch frequency different from a drive frequency of the wavelength actuator.

BRIEF DESCRIPTION OF THE DRAWINGS

Embodiments of the present disclosure will be described below merely as examples with reference to the accompanying drawings.

DESCRIPTION OF EMBODIMENTS

<Contents>

Figure 1:
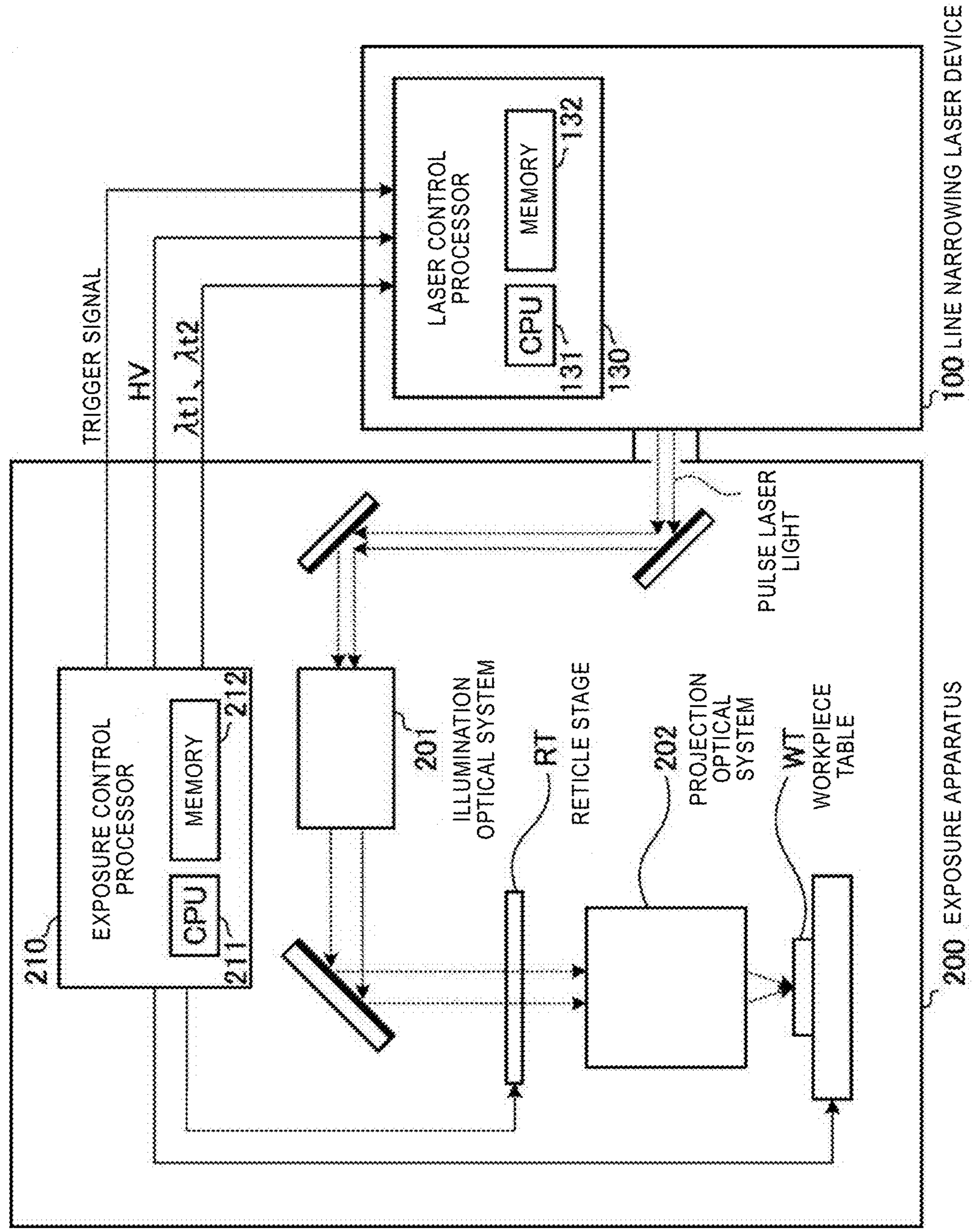
FIG. 1 schematically shows the configuration of an exposure system of a comparative example.

1. Comparative example
  1.1 Exposure system
    1.1.1 Configuration
    1.1.2 Operation
  1.2 Line narrowing laser device 100
    1.2.1 Configuration
    1.2.2 Operation
  1.3 Line narrowing module 14
    1.3.1 Configuration
    1.3.2 Operation
  1.4 Periodic change of wavelength
  1.5 Problem of comparative example
2. Line narrowing laser device **100*a* including fixed notch filter 18*a***
  2.1 Configuration
  2.2 Operation
  2.3 Effect
3. Fixed notch filter **18*b*** including bandpass filters in plurality of stages
  3.1 Configuration
  3.2 Operation
  3.3 Effect
4. Line narrowing laser device **100*c* including variable notch filter 18*c***
  4.1 Configuration
  4.2 Operation
    4.2.1 Adjustment of notch parameters based on deviations Dλ1, Dλ2 between measurement wavelengths λc1, λc2 and target wavelengths λt1, λt2
      4.2.1.1 Adjustment of notch frequency Fn
      4.2.1.2 Adjustment of notch gain depth Gn
    4.2.2 Adjustment of notch parameters based on wavelength difference between measurement wavelengths λt1 and λt2
  4.3 Variable notch filter including bandpass filters in plurality of stages
  4.4 Effect
5. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

1. Comparative Example

1.1 Exposure System

FIG. 1 schematically shows the configuration of an exposure system of a comparative example. The comparative example of the present disclosure is an example recognized by the applicant as known only by the applicant, and is not a publicly known example admitted by the applicant.

The exposure system includes a line narrowing laser device 100 and an exposure apparatus 200. In FIG. 1, the line narrowing laser device 100 is shown in a simplified manner.

The line narrowing laser device 100 includes a laser control processor 130. The laser control processor 130 is a processing device including a memory 132 in which a control program is stored, and a central processing unit (CPU) 131 which executes the control program. The laser control processor 130 is specifically configured or programmed to perform various processes included in the present disclosure. The laser control processor 130 corresponds to the processor in the present disclosure. The line narrowing laser device 100 is configured to output pulse laser light toward the exposure apparatus 200.

1.1.1 Configuration

As shown in FIG. 1, the exposure apparatus 200 includes an illumination optical system 201, a projection optical system 202, and an exposure control processor 210.

The illumination optical system 201 illuminates a reticle pattern of a reticle (not shown) arranged on a reticle stage RT with the pulse laser light having entered from the line narrowing laser device 100.

The projection optical system 202 causes the pulse laser light transmitted through the reticle to be imaged as being reduced and projected on a workpiece (not shown) arranged on a workpiece table WT. The workpiece is a photosensitive substrate such as a semiconductor wafer on which a resist film is applied.

The exposure control processor 210 is a processing device including a memory 212 in which a control program is stored and a CPU 211 which executes the control program. The exposure control processor 210 is specifically configured or programmed to perform various processes included in the present disclosure. The exposure control processor 210 performs overall control of the exposure apparatus 200.

1.1.2 Operation

The exposure control processor 210 transmits various parameters including target wavelengths λt1, λt2 and a voltage command value HV, and a trigger signal to the laser control processor 130. The laser control processor 130 controls the line narrowing laser device 100 in accordance with these parameters and signals. The target wavelengths λt1, λt2 are target values of the wavelength. The target wavelength λt2 is a wavelength larger than the target wavelength λt1.

The exposure control processor 210 synchronously translates the reticle stage RT and the workpiece table WT in opposite directions to each other. Thus, the workpiece is exposed to the pulse laser light reflecting the reticle pattern.

By such an exposure process, the reticle pattern is transferred onto the semiconductor wafer. Thereafter, an electronic device can be manufactured through a plurality of processes.

1.2 Line Narrowing Laser Device 100

1.2.1 Configuration

Figure 2:
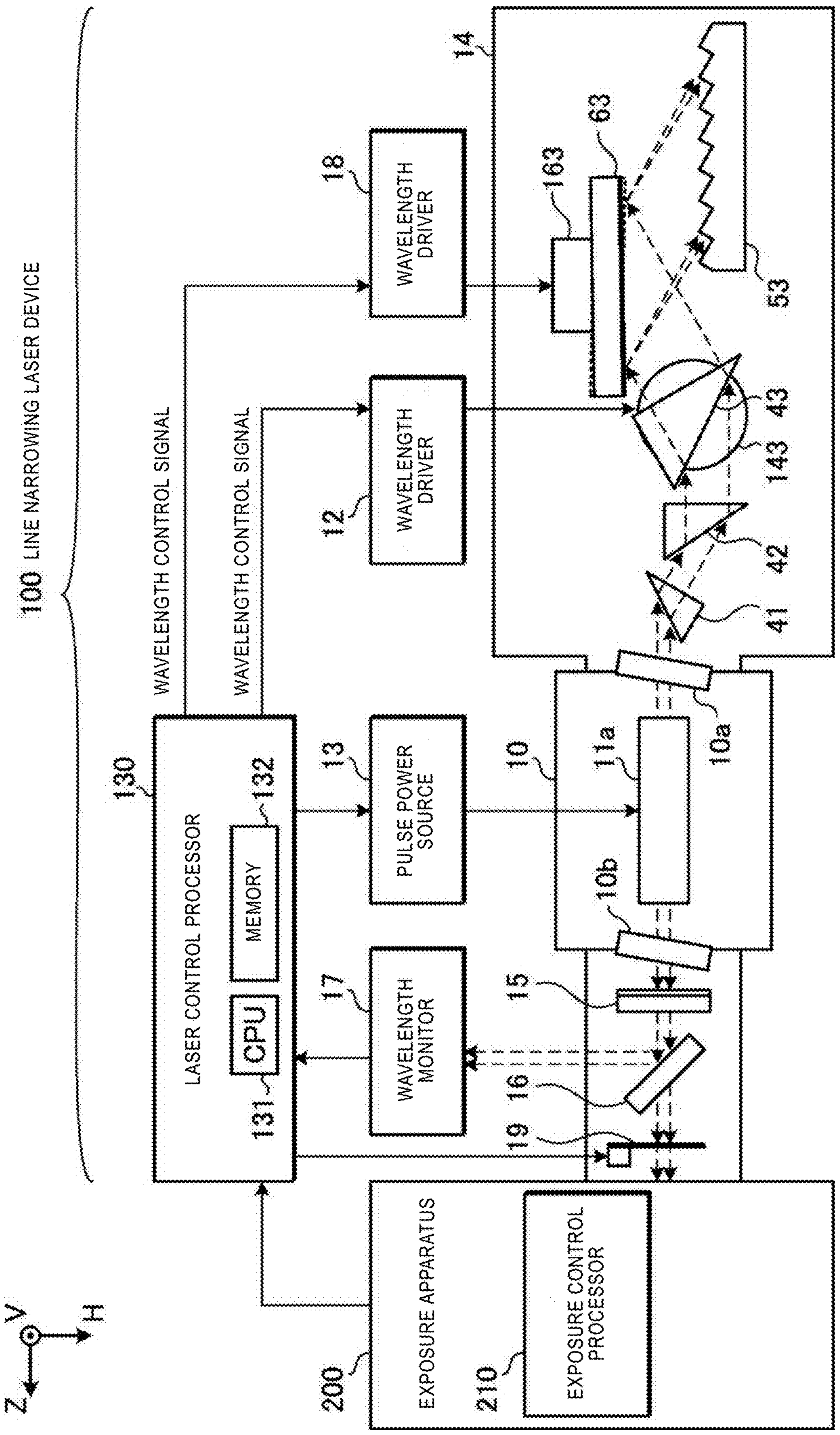
FIG. 2 schematically shows the configuration of a line narrowing laser device of the comparative example.

FIG. 2 schematically shows the configuration of the line narrowing laser device 100 of the comparative example. In FIG. 2, the exposure apparatus 200 is shown in a simplified manner, and a V axis, an H axis, and a Z axis perpendicular to one another are shown.

The line narrowing laser device 100 is a discharge-excitation type laser device, and includes a laser chamber 10, a pulse power source 13, a line narrowing module 14, an output coupling mirror 15, and a wavelength monitor 17, in addition to the laser control processor 130. The line narrowing module 14 and the output coupling mirror 15 configure an optical resonator.

The laser chamber 10 is arranged on the optical path of the optical resonator. The laser chamber 10 is provided with two windows 10*a*, 10*b*. The laser chamber 10 accommodates a discharge electrode 11*a* and a discharge electrode (not shown) paired with the discharge electrode 11*a*. The discharge electrode (not shown) is positioned so as to overlap with the discharge electrode 11*a* along the V axis. The laser chamber 10 is filled with a laser gas containing, for example, an argon gas or a krypton gas as a rare gas, a fluorine gas as a halogen gas, a neon gas as a buffer gas, and the like.

The pulse power source 13 includes a charger (not shown), a charging capacitor (not shown), and a switch (not shown). The charger holds electric energy to be supplied to the charging capacitor and is connected to the charging capacitor. The charging capacitor is connected to the discharge electrode 11*a* via the switch.

The line narrowing module 14 includes prisms 41 to 43, a grating 53, a mirror 63, and rotation stages 143, 163. The rotation stage 143 is connected to a wavelength driver 12, and the rotation stage 163 is connected to a wavelength driver 18. The grating 53 corresponds to the diffractive optical element in the present disclosure. The mirror 63 corresponds to the optical element in the present disclosure. The rotation stage 163 corresponds to the wavelength actuator in the present disclosure. Details of the line narrowing module 14 will be described later.

The output coupling mirror 15 is configured by a partial reflection mirror.

A beam splitter 16 that transmits a part of the pulse laser light at high transmittance and reflects the other part is arranged on the optical path of the pulse laser light output from the output coupling mirror 15. The wavelength monitor 17 is arranged on the optical path of the pulse laser light reflected by the beam splitter 16. The wavelength monitor 17 includes an etalon spectrometer (not shown) and is configured to acquire a light intensity distribution of interference fringes. The radii of the interference fringes depends on the change in wavelength.

A shutter 19 is arranged on the optical path of the pulse laser light transmitted through the beam splitter 16.

1.2.2 Operation

The laser control processor 130 acquires various parameters including the target wavelengths λt1, λt2 and the voltage command value HV from the exposure control processor 210. The laser control processor 130 controls the line narrowing module 14 by outputting a wavelength control signal to the wavelength drivers 12, 18 based on the target wavelengths λt1, λt2. The laser control processor 130 sets the voltage command value HV to the charger included in the pulse power source 13.

The laser control processor 130 receives the trigger signal from the exposure control processor 210. The laser control processor 130 transmits an oscillation trigger signal based on the trigger signal to the pulse power source 13. The switch included in the pulse power source 13 is turned on when the oscillation trigger signal is received from the laser control processor 130. When the switch is turned on, the pulse power source 13 generates a pulse high voltage from the electric energy charged in the charger, and applies the high voltage to the discharge electrode 11*a*.

When the high voltage is applied to the discharge electrode 11*a*, discharge occurs at a discharge space between the discharge electrode 11*a* and the discharge electrode (not shown). The laser gas in the laser chamber 10 is excited by the energy of the discharge and shifts to a high energy level. When the excited laser gas then shifts to a low energy level, light having a wavelength corresponding to the difference between the energy levels is emitted.

The light generated in the laser chamber 10 is output to the outside of the laser chamber 10 through the windows 10*a*, 10*b*. The light output from the window 10*a* enters the line narrowing module 14. Among the light having entered the line narrowing module 14, the light having a wavelength near a desired wavelength is turned back by the line narrowing module 14 and returned to the laser chamber 10.

The output coupling mirror 15 transmits and outputs, as pulse laser light, a part of the light output from the window 10*b*, and reflects the other part back into the laser chamber 10.

In this way, the light output from the laser chamber 10 reciprocates between the line narrowing module 14 and the output coupling mirror 15. This light is amplified every time when passing through the discharge space in the laser chamber 10. Further, the light is line-narrowed every time when being turned back by the line narrowing module 14, and becomes light having a steep wavelength distribution with a part of a range of wavelength selected by the line narrowing module 14 as a center wavelength. Thus, the light having undergone laser oscillation and line narrowing is output as pulse laser light from the output coupling mirror 15. The wavelength of the pulse laser light refers to the center wavelength unless otherwise specified.

The wavelength monitor 17 transmits the light intensity distribution of the interference fringes generated by the pulse laser light to the laser control processor 130. The laser control processor 130 calculates the measurement wavelength based on the light intensity distribution of the interference fringes, and outputs the wavelength control signal to the wavelength drivers 12, 18 based on the measurement wavelength, thereby performing feedback control on the line narrowing module 14.

The shutter 19 is configured to be switchable between a first state of allowing the pulse laser light to pass therethrough toward the exposure apparatus 200 and a second state of suppressing the pulse laser light from passing therethrough toward the exposure apparatus 200. The switching between the first state and the second state is controlled by the laser control processor 130.

The pulse laser having passed through the shutter 19 when the shutter 19 is in the first state enters the exposure apparatus 200. An energy monitor (not shown) included in the exposure apparatus 200 measures the pulse energy of the pulse laser light. The exposure control processor 210 calculates the voltage command value HV based on the measured pulse energy and the target pulse energy, and transmits the voltage command value Hv to the laser control processor 130. The pulse energy of the pulse laser light is controlled in accordance with the voltage command value HV.

1.3 Line Narrowing Module 14

1.3.1 Configuration

The prisms 41, 42, 43 are arranged in this order on the optical path of the light beam output from the window 10*a*. The prisms 41 to 43 are arranged such that the surfaces of the prisms 41 to 43 on and from which the light beam is incident and output are parallel to the V axis, and are respectively supported by holders (not shown). The prism 43 is rotatable about an axis parallel to the V axis by the rotation stage 143. Examples of the rotation stage 143 include a rotation stage including a stepping motor and having a large movable range.

The mirror 63 is arranged on the optical path of the light beam transmitted through the prisms 41 to 43. The mirror 63 is arranged such that the surface for reflecting the light beam is parallel to the V axis, and is rotatable about an axis parallel to the V axis by the rotation stage 163. Examples of the rotation stage 163 include a rotation stage including a piezoelectric element and having high responsiveness.

Alternatively, the prism 42 may be rotatable by the rotation stage 143, the prism 43 may be rotatable by the rotation stage 163, and the mirror 63 may not be rotatable. In this case, the prism 43 corresponds to the optical element in the present disclosure.

The grating 53 is arranged on the optical path of the light beam reflected by the mirror 63. The direction of the grooves of the grating 53 is parallel to the V axis. The grating 53 is supported by a holder (not shown).

1.3.2 Operation

The travel direction of the light beam output from the window 10*a* is changed by each of the prisms 41 to 43 in a plane parallel to the HZ plane which is a plane perpendicular to the V axis, and the beam width is expanded in the plane parallel to the HZ plane.

The light beam transmitted through the prisms 41 to 43 is reflected by the mirror 63 and is incident on the grating 53.

The light beam incident on the grating 53 is reflected by the plurality of grooves of the grating 53 and is diffracted in a direction corresponding to the wavelength of the light. The grating 53 is arranged in the Littrow arrangement, which causes the incident angle of the light beam incident on the grating 53 from the mirror 63 to coincide with the diffraction angle of the diffracted light having the desired wavelength.

The mirror 63 reflects the light returned from the grating 53 toward the prism 43. The prisms 41 to 43 reduce the beam width of the light reflected by the mirror 63 in the plane parallel to the HZ plane and return the light into the laser chamber 10 through the window 10*a*.

The wavelength drivers 12, 18 drive the rotation stages 143, 163, respectively, by outputting a drive signal based on the wavelength control signal. In accordance with the rotation angles of the rotation stages 143, 163, the incident angle of the light beam incident on the grating 53 changes, and the wavelength selected by the line narrowing module 14 changes. The rotation stage 143 is mainly used for coarse adjustment, and the rotation stage 163 is mainly used for fine adjustment.

1.4 Periodic Change of Wavelength

Figure 3:
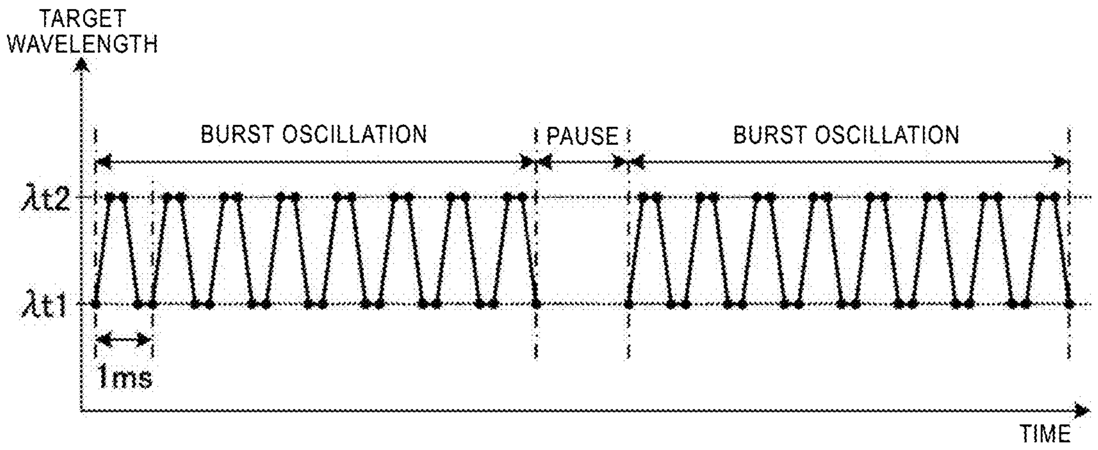
FIG. 3 is a graph showing an example in which a target wavelength of pulse laser light is periodically changed.

FIG. 3 is a graph showing an example in which the target wavelength of the pulse laser light is periodically changed. In FIG. 3, the horizontal axis represents time and the vertical axis represents the target wavelength.

The line narrowing laser device 100 performs laser oscillation at a repetition frequency equal to or higher than a predetermined value over a certain period in accordance with the trigger signal from the exposure control processor 210. Performing laser oscillation at a repetition frequency equal to or higher than a predetermined value to output the pulse laser light is referred to as "burst oscillation."

When the trigger signal from the exposure control processor 210 is paused, the line narrowing laser device 100 pauses the burst oscillation. Thereafter, in accordance with the trigger signal from the exposure control processor 210, the line narrowing laser device 100 performs the burst oscillation again.

The period in which the burst oscillation is performed corresponds, for example, to the period in which exposure of one exposure area of a semiconductor wafer is performed in the exposure apparatus 200. The period in which the burst oscillation is paused corresponds, for example, to the period in which the imaging position of a reticle pattern is moved from one exposure area to another in the exposure apparatus 200 or the period in which the semiconductor wafer is replaced. Adjustment oscillation for adjusting various parameters may be performed in the pause period.

Based on the target wavelengths λt1, λt2 received from the exposure control processor 210, the laser control processor 130 outputs the wavelength control signal to the wavelength driver 18 and controls the rotation stage 163 so that the posture of the mirror 63 periodically changes for every plurality of pulses. As a result, the wavelength of the pulse laser light periodically changes for every plurality of pulses.

In the example shown in FIG. 3, the wavelength is periodically switched every 4 pulses between the target wavelengths λt1 and λt2. The first and fourth pulses are generated at the target wavelength λt1 and the second and third pulses are generated at the target wavelength λt2. Similarly thereafter, generation of 2 pulses at the target wavelength λt1 and generation of 2 pulses at the target wavelength λt2 are repeated. The wavelength control signal is generated as a rectangular wave, and for example, the cycle of the wavelength change is 1 ms, that is, the frequency of the wavelength control signal is 1 kHz. In this case, the drive signal output from the wavelength driver 18 to the rotation stage 163 is also a rectangular wave having a drive frequency of 1 kHz. The repetition frequency of the pulse laser light is 4 kHz.

Here, description has been provided on a case in which the wavelength of the pulse laser light is periodically switched between two target wavelengths λt1 and λt2, but may be switched among three or more target wavelengths. In this way, the line narrowing laser device 100 can perform two-wavelength oscillation or multiple-wavelength oscillation.

The focal length in the exposure apparatus 200 depends on the wavelength of the pulse laser light. Since the imaging position of the pulse laser light in the direction of the optical path axis is periodically changed due to the periodic change of the target wavelength, the focal depth can be substantially increased. For example, even when a resist film having a large thickness is exposed, the imaging performance in the thickness direction of the resist film can be maintained.

Alternatively, the resist profile indicating the cross-sectional shape of the developed resist film may be adjusted.

1.5 Problem of Comparative Example

However, when the target wavelength is periodically changed at a high speed, operation of the rotation stage 163 cannot accurately follow the change of the target wavelength, and the wavelength of the pulse laser light cannot be accurately controlled in some cases.

Figure 4:
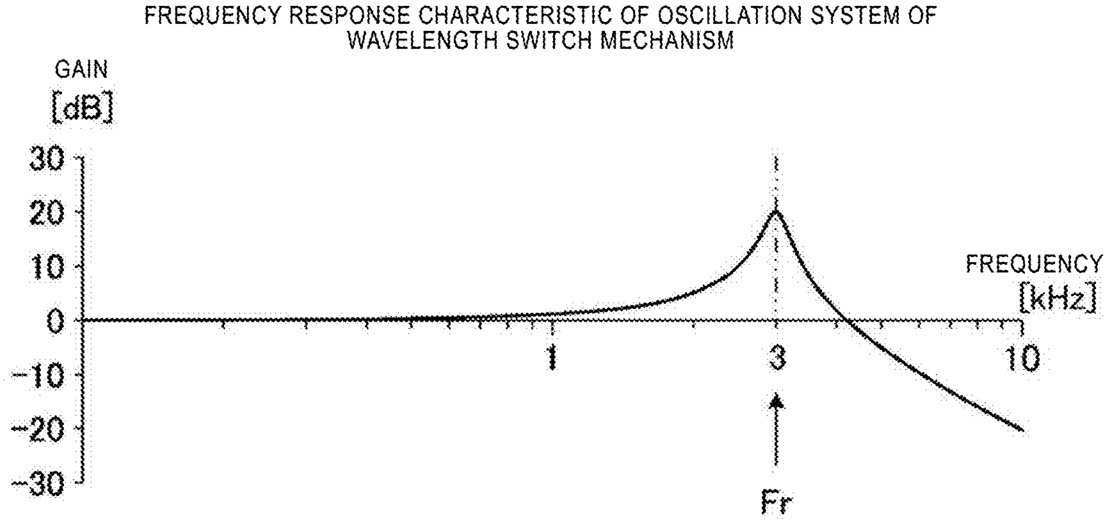
FIG. 4 is a graph showing a frequency response characteristic of an oscillation system of a wavelength switch mechanism of the comparative example.

FIG. 4 is a graph showing a frequency response characteristic of an oscillation system of a wavelength switch mechanism of the comparative example. In FIG. 4, the horizontal axis represents the frequency, and the vertical axis represents a gain. The oscillation system of the wavelength switch mechanism in the present disclosure is a oscillation system that oscillates by periodic driving of a wavelength actuator such as the rotation stage 163, and includes a wavelength actuator, a mechanical component that holds the wavelength actuator, an optical element such as the mirror 63 that is driven by the wavelength actuator, a component that couples the wavelength actuator and the optical element, and a mechanical drive component that transmits a driving force to the optical element. The oscillation system of the wavelength switch mechanism has at least one resonant frequency Fr. It is desirable that the oscillation system of the wavelength switch mechanism has the resonant frequency Fr higher than the drive frequency of the rotation stage 163. In the example shown in FIG. 4, the resonant frequency Fr is 3 kHz.

Figure 5:
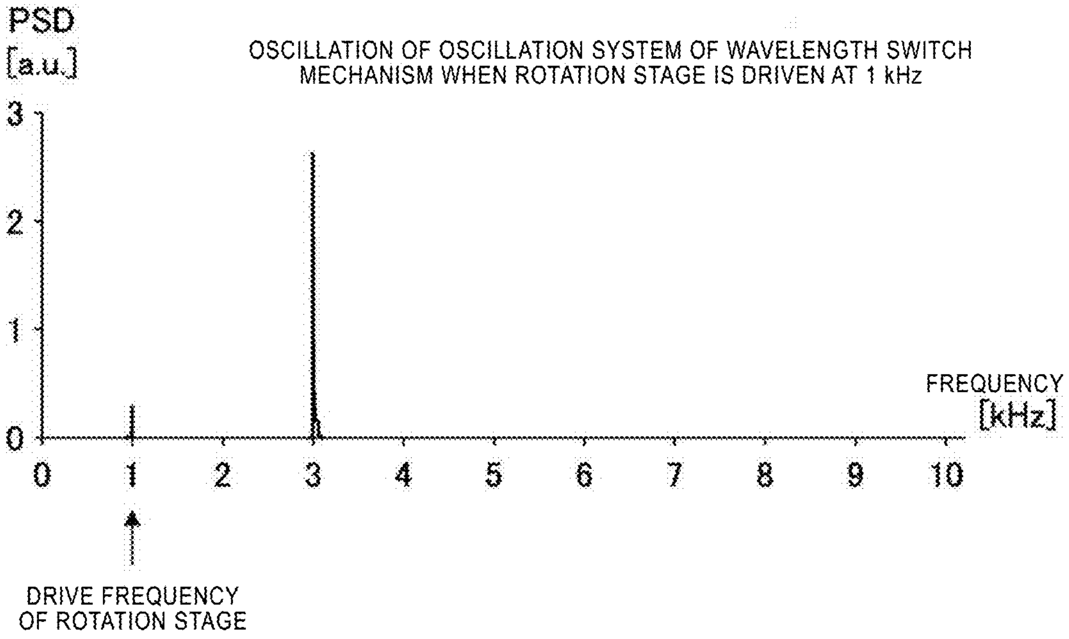
FIG. 5 is a graph showing a spectrum of an oscillation frequency of the oscillation system of the wavelength switch mechanism when a rotation stage is driven at a drive frequency of 1 kHz in the comparative example.

FIG. 5 is a graph showing a spectrum of the oscillation frequency of the oscillation system of the wavelength switch mechanism when the rotation stage 163 is driven at a drive frequency of 1 kHz in the comparative example. In FIG. 5, the horizontal axis represents the frequency, and the vertical axis represents a power spectral density (PSD).

When the drive signal input to the rotation stage 163 is a rectangular wave having a drive frequency of 1 kHz, the drive signal is represented as a sum of frequency components of odd multiples of the drive frequency by Fourier series expansion. Therefore, the frequency components of odd multiples of the drive frequency included in the drive signal may cause the oscillation system of the wavelength switch mechanism to oscillate. For example, when 3 kHz which is an odd multiple of the drive frequency coincides with the resonant frequency Fr (see FIG. 4) of the oscillation system of the wavelength switch mechanism, the oscillation system may oscillate not only at the drive frequency of 1 kHz but also greatly at 3 kHz.

Figure 6:
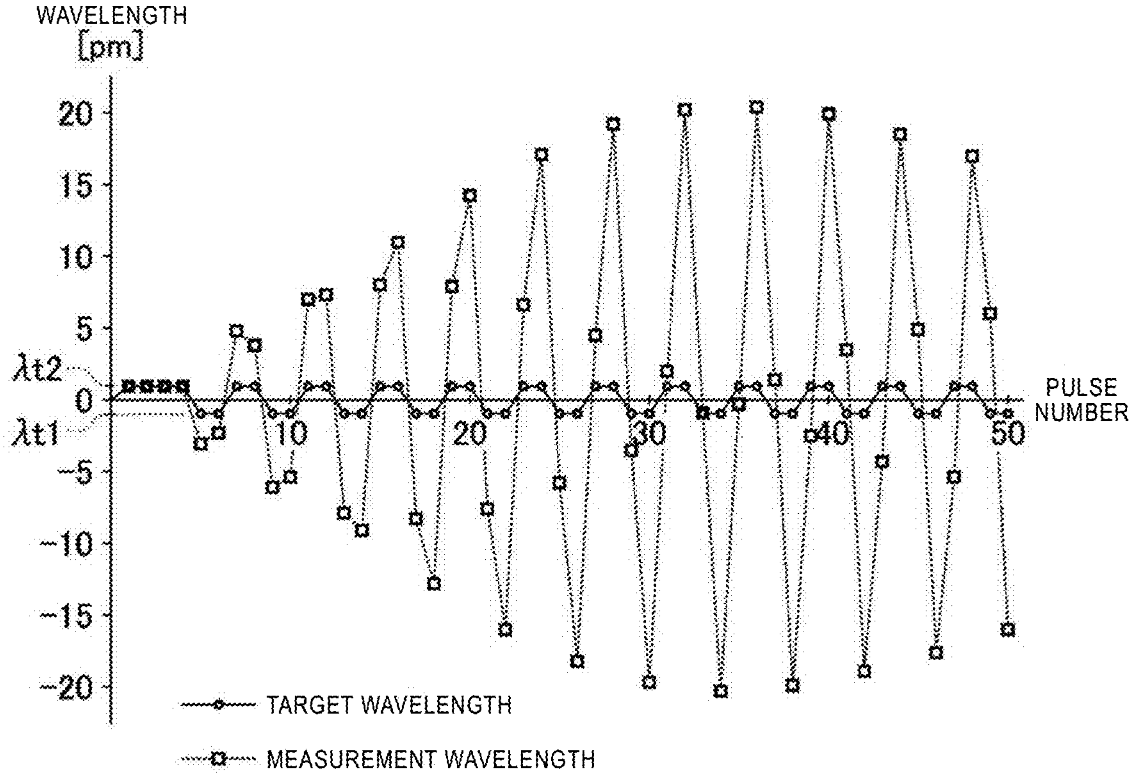
FIG. 6 is a graph showing the relationship between the target wavelength and a measurement wavelength in the comparative example.

FIG. 6 is a graph showing the relationship between the target wavelength and the measurement wavelength in the comparative example. In FIG. 6, the horizontal axis represents a pulse number, and the vertical axis represents the deviation of the wavelength assuming that the average of the target wavelengths λt1 and λt2 is 0. When the repetition frequency of the pulse laser light is set to 4 kHz, the drive frequency of the drive signal input to the rotation stage 163 is set to 1 kHz, and the difference between the target wavelengths λt1 and λt2 is set to 2 μm, the measurement wavelength has greatly deviated from the target wavelength in some cases.

2. Line Narrowing Laser Device **100*a* Including Fixed Notch Filter 18*a***

2.1 Configuration

Figure 7:
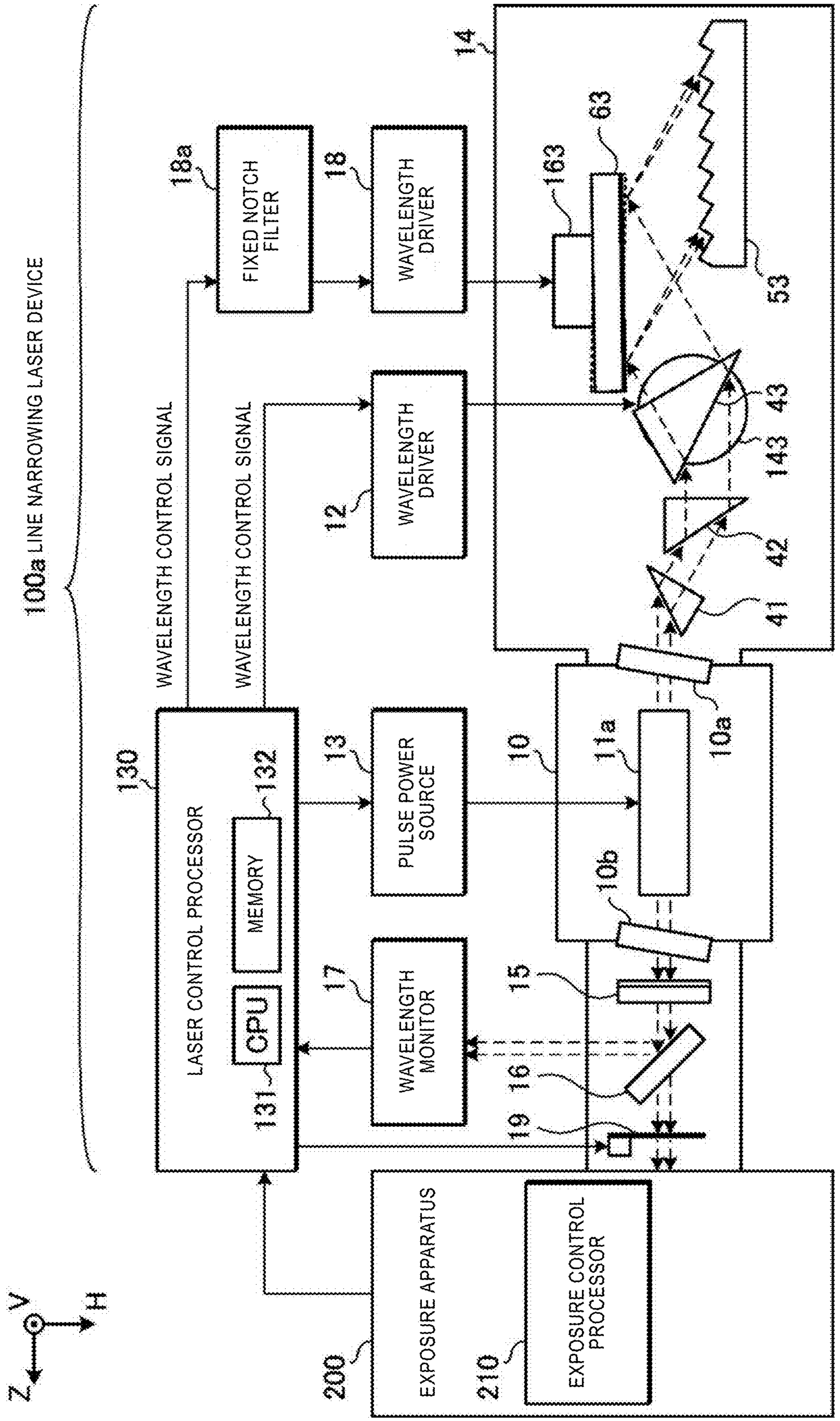
FIG. 7 schematically shows the configuration of the line narrowing laser device of a first embodiment.

FIG. 7 schematically shows the configuration of a line narrowing laser device **100*a* of a first embodiment. In the first embodiment, a fixed notch filter 18*a* is arranged in the path of the wavelength control signal between the laser control processor 130 and the wavelength driver 18. The fixed notch filter 18*a*** is an example of the notch filter in the present disclosure. The notch filter is an electric circuit that attenuates a part of frequency components included in the wavelength control signal and allows the wavelength control signal to pass therethrough.

Figure 8:
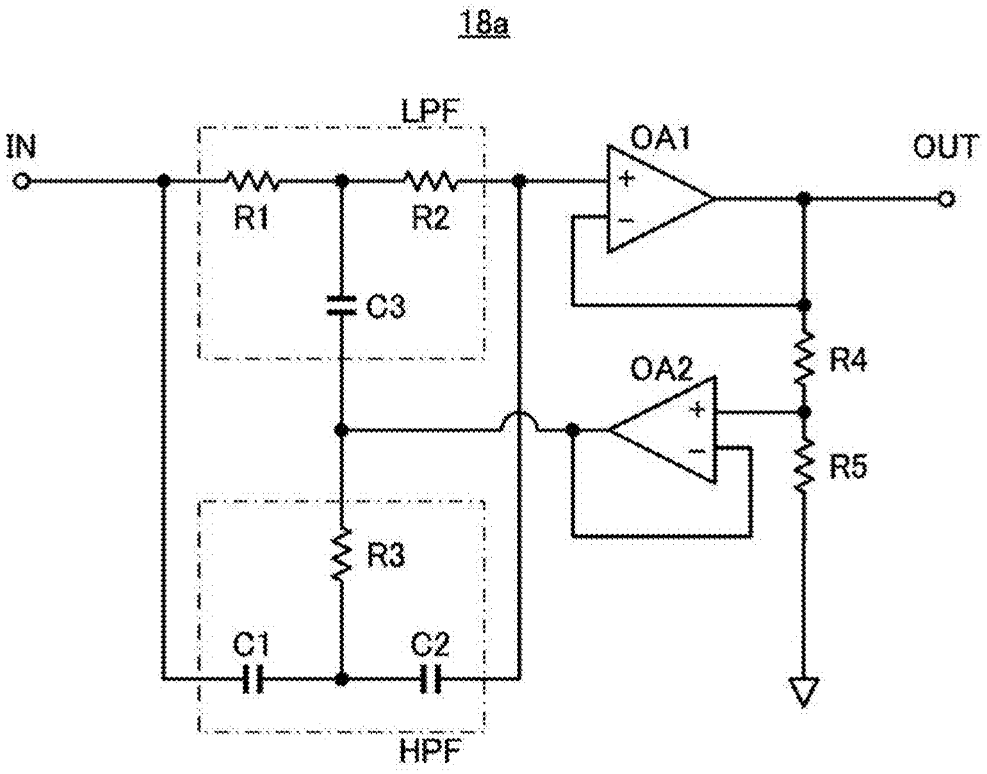
FIG. 8 is a circuit diagram showing an example of a fixed notch filter included in the first embodiment.

FIG. 8 is a circuit diagram showing an example of the fixed notch filter **18*a* included in the first embodiment. The fixed notch filter 18*a* includes a low-pass filter LPF and a high-pass filter HPF connected in parallel, an operational amplifier OA1 connected to the output side of each of the low-pass filter LPF and the high-pass filter HPF, and an operational amplifier OA2 connected to the output side of the operational amplifier OA1**.

The low-pass filter LPF includes resistive elements R1, R2 and a capacitor C3. The low-pass filter LPF attenuates high-frequency components of an input signal IN and allows low-frequency components thereof to pass therethrough.

The high-pass filter HPF includes capacitors C1, C2 and a resistive element R3. The high-pass filter HPF attenuates low-frequency components of the input signal IN and allows high-frequency components thereof to pass therethrough.

Resistance values of the resistive elements R1, R2, R3 are represented by $R_1$, $R_2$, $R_3$, respectively, and the relationship thereof is set to $R_1=R_2=2R_3$. Capacitance values of the capacitors C1, C2, C3 are represented by $C_1$, $C_2$, $C_3$, respectively, and the relationship thereof is set to $C_1=C_2=C_3/2$.

The operational amplifier OA1 amplifies and outputs a signal obtained by combining the low frequency components that have passed through the low-pass filter LPF and the high frequency components that have passed through the high-pass filter HPF. A frequency attenuated by both the low-pass filter LPF and the high-pass filter HPF is called a notch frequency Fn (see FIG. 9) and is given by $1/(2\pi C_1 R_1)$. The fixed notch filter **18*a*** attenuates the frequency component of the notch frequency Fn more than other frequency components and allows the frequency components to pass therethrough.

The operational amplifier OA2 positively feeds back a part of an output signal OUT of the operational amplifier OA1 between the capacitor C3 of the low-pass filter LPF and the resistive element R3 of the high-pass filter HPF. The feedback rate by the operational amplifier OA2 is determined by the ratio of the resistance values of resistive elements R4, R5 configuring a voltage divider. By arranging the operational amplifier OA2, the gain of the frequency components other than the notch frequency Fn by the fixed notch filter **18*a* can be brought close to 0, and the part in the vicinity of the notch frequency Fn among the curve representing the frequency response characteristic of the fixed notch filter 18*a* described later with reference to FIG. 9** can be made steeper.

2.2 Operation

Figure 9:
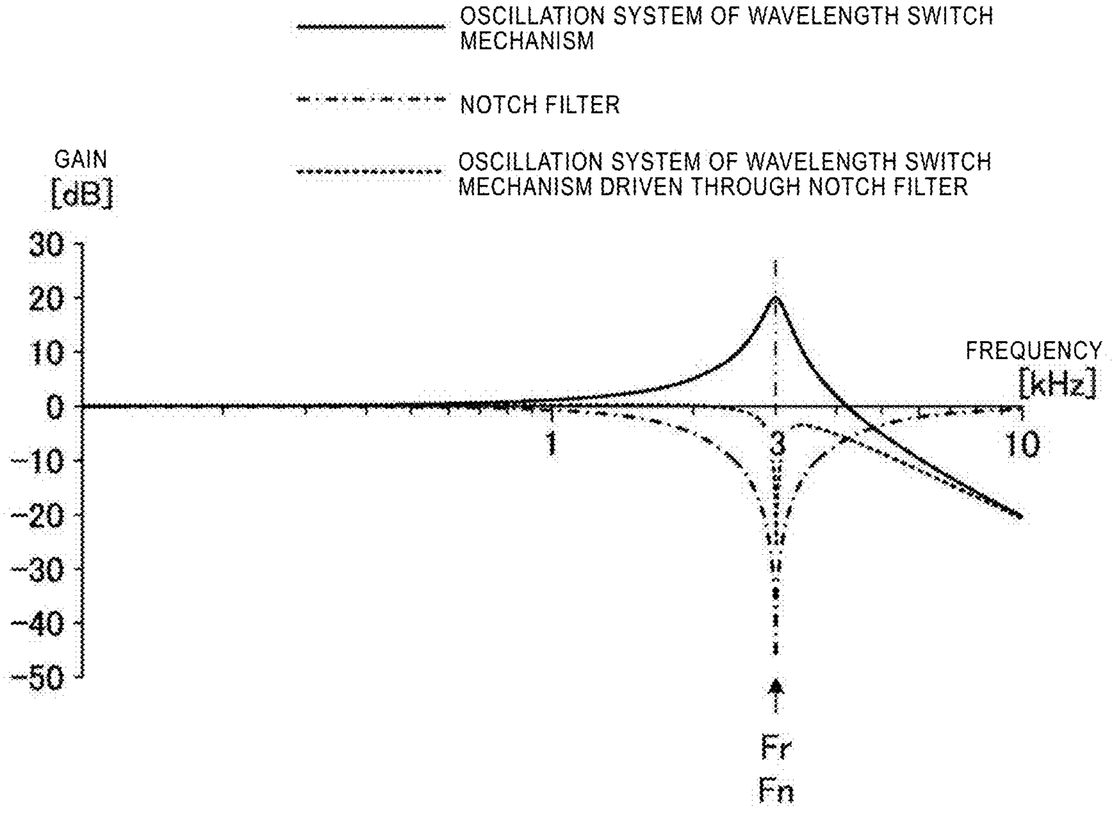
FIG. 9 is a graph showing the frequency response characteristics of the oscillation system of the wavelength switch mechanism and the fixed notch filter of the first embodiment.

FIG. 9 is a graph showing the frequency response characteristics of the oscillation system of the wavelength switch mechanism and the fixed notch filter **18*a*** of the first embodiment.

The frequency response characteristic of the oscillation system of the wavelength switch mechanism is similar to that shown in FIG. 4 and has, for example, the resonant frequency Fr of 3 kHz.

The fixed notch filter **18*a*** attenuates the wavelength control signal significantly at the notch frequency Fn, and allows the wavelength control signal to pass therethrough without significant attenuation at other frequency regions.

The notch frequency Fn is a frequency different from the drive frequency of the rotation stage 163, preferably a frequency higher than the drive frequency, and more preferably a frequency of multiplication n of the drive frequency by an odd number larger than 1. As a result, the gain at the notch frequency Fn is suppressed in the frequency response characteristic of the oscillation system of the wavelength switch mechanism driven through the fixed notch filter 18*a*.

The notch frequency Fn is set to about 3 kHz, for example, in accordance with the resonant frequency Fr of the oscillation system of the wavelength switch mechanism. In this case, in the frequency response characteristic of the oscillation system of the wavelength switch mechanism driven through the fixed notch filter 18*a*, resonance at the resonant frequency Fr of 3 kHz is suppressed.

Figure 10:
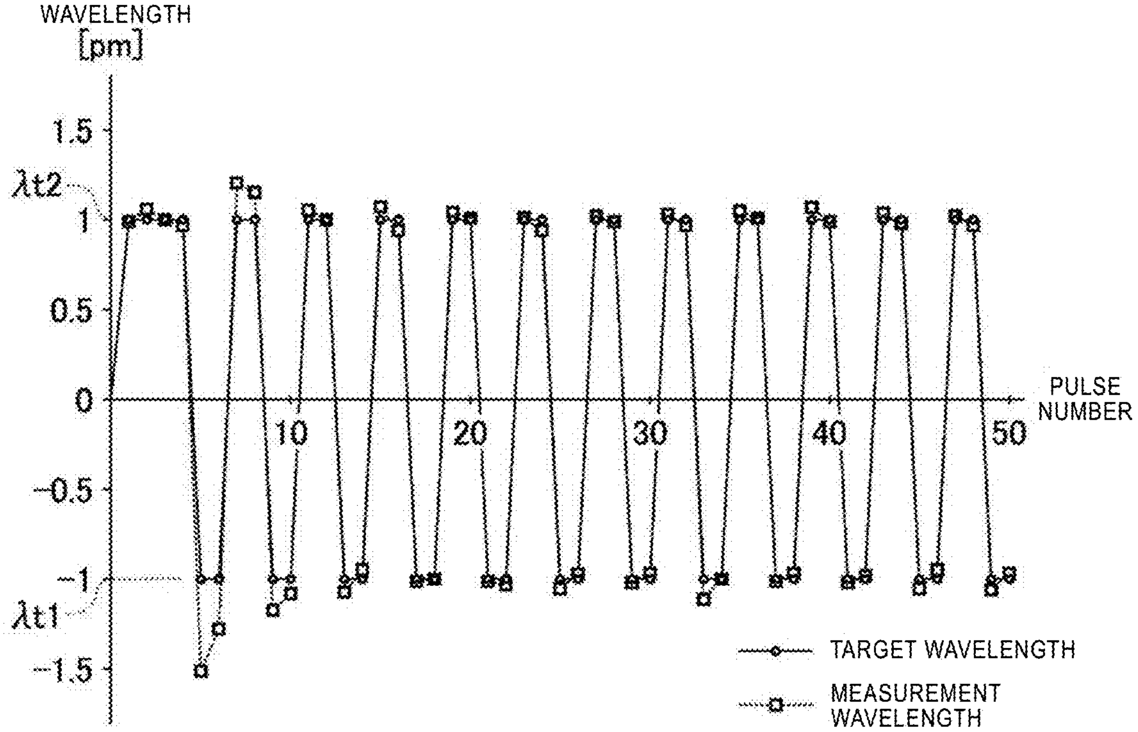
FIG. 10 is a graph showing a first example of the relationship the target wavelength the between and measurement wavelength in the first embodiment.

FIG. 10 is a graph showing a first example of the relationship between the target wavelength and the measurement wavelength in the first embodiment. In the first embodiment, although a slight deviation occurs between the target wavelength and the measurement wavelength at the beginning of a burst, the measurement wavelength does not greatly deviate from the target wavelength from around the 10th pulse, and thus follows well the change of the target wavelength.

2.3 Effect (1) According to the first embodiment, the line narrowing laser device 100*a* includes the mirror 63, the grating 53, the rotation stage 163, the wavelength driver 18, the laser control processor 130, and the fixed notch filter 18*a*. The mirror 63 and the grating 53 are positioned on the optical path of the optical resonator. The rotation stage 163 changes the incident angle of light incident on the grating 53 by moving the mirror 63. The wavelength driver 18 drives the rotation stage 163. The laser control processor 130 outputs the wavelength control signal to the wavelength driver 18 so that the wavelength of the pulse laser light output from the optical resonator periodically changes. The fixed notch filter 18*a* is arranged in the path of the wavelength control signal and operates at the notch frequency Fn different from the drive frequency of the rotation stage 163.

Accordingly, since the fixed notch filter 18*a* is arranged in the path of the wavelength control signal, the frequency component of the wavelength control signal at the notch frequency Fn that is different from the drive frequency is attenuated by the fixed notch filter 18*a*, and the periodic wavelength change by the drive frequency can be accurately performed.

(2) According to the first embodiment, the notch frequency Fn is higher than the drive frequency.

Accordingly, the frequency component at the notch frequency Fn higher than the drive frequency is attenuated by the fixed notch filter 18*a*, and the periodic wavelength change by the drive frequency can be accurately performed.

(3) According to the first embodiment, the notch frequency Fn is a frequency of multiplication of the drive frequency by an odd number larger than 1.

Accordingly, the frequency component at a frequency of multiplication of the drive frequency by an odd number larger than 1 is attenuated by the fixed notch filter 18*a*, and the periodic wavelength change by the drive frequency can be accurately performed.

(4) According to the first embodiment, the notch frequency Fn is set in accordance with the resonant frequency Fr of the oscillation system of the wavelength switch mechanism which oscillates by periodic driving of the rotation stage 163.

Accordingly, the oscillation the natural of oscillation system can be suppressed by attenuating the frequency component at the resonant frequency Fr of the oscillation system of the wavelength switch mechanism by the fixed notch filter 18*a*, and the periodic wavelength change by the drive frequency can be accurately performed.

In other respects, the first embodiment is similar to the comparative example.

Figure 11:
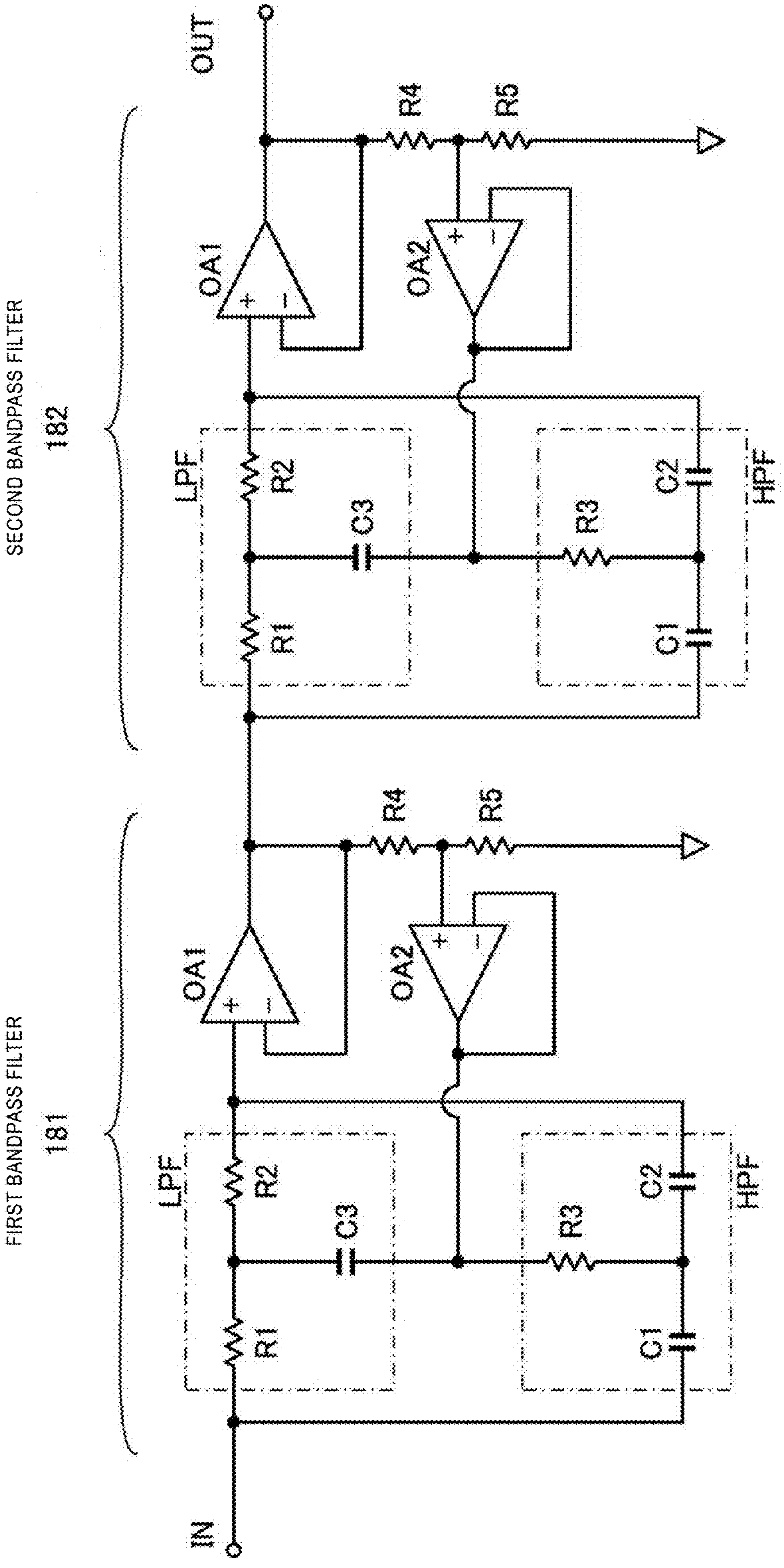
FIG. 11 is a circuit diagram showing an example of the fixed notch filter included in a second embodiment.

3. Fixed Notch Filter 18*b* Including Bandpass Filters in Plurality of Stages 3.1 Configuration FIG. 11 is a circuit diagram showing an example of a fixed notch filter 18*b* included in a second embodiment. The fixed notch filter 18*b* includes first and second bandpass filters 181, 182. The second bandpass filter 182 is connected in series to the output side of the first bandpass filter 181. The configuration of each of the first and second bandpass filters 181, 182 is similar to the fixed notch filter 18*a* shown in FIG. 8. The first and second bandpass filters 181, 182 have the same characteristic as each other, and for example the notch frequency Fn of the both is $1/(2\pi C_1 R_1)$. A notch gain depth Gn described later is also the same for the first and second bandpass filters 181, 182. The fixed notch filter 18*b* is an example of the notch filter in the present disclosure.

3.2 Operation

Figure 12:
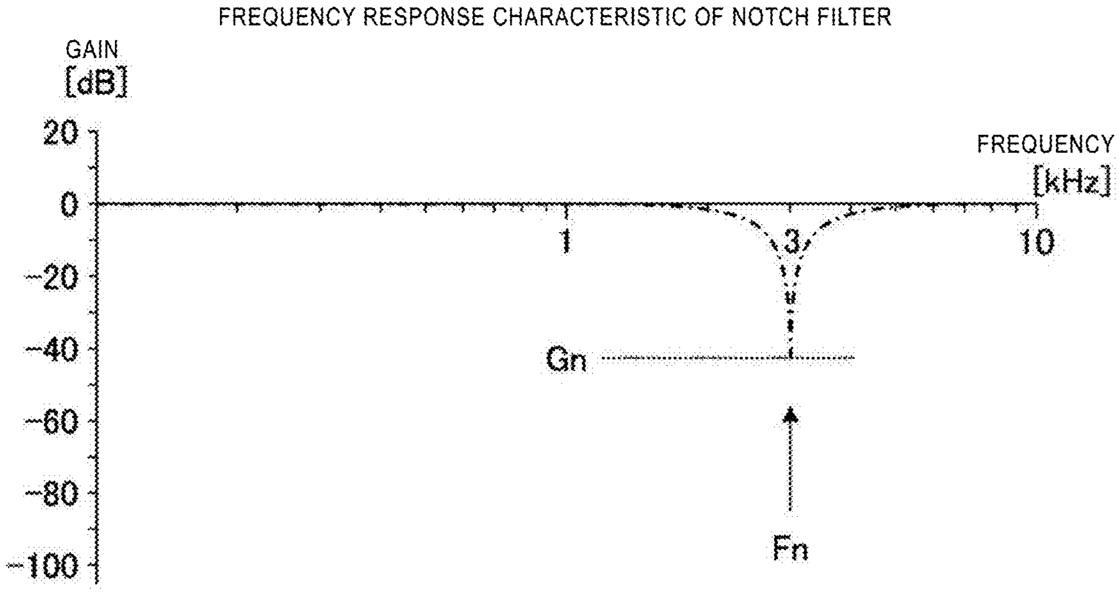
FIG. 12 is a graph showing the frequency response characteristic of the fixed notch filter of the first embodiment.

FIG. 12 is a graph showing the frequency response characteristic of the fixed notch filter 18*a* of the first embodiment. FIG. 12 corresponds to the frequency response characteristic of the fixed notch filter 18*a* shown in FIG. 9 with the scale of the vertical axis changed. The minimum value of the gain of the notch filter is referred to as the notch gain depth Gn.

Figure 13:
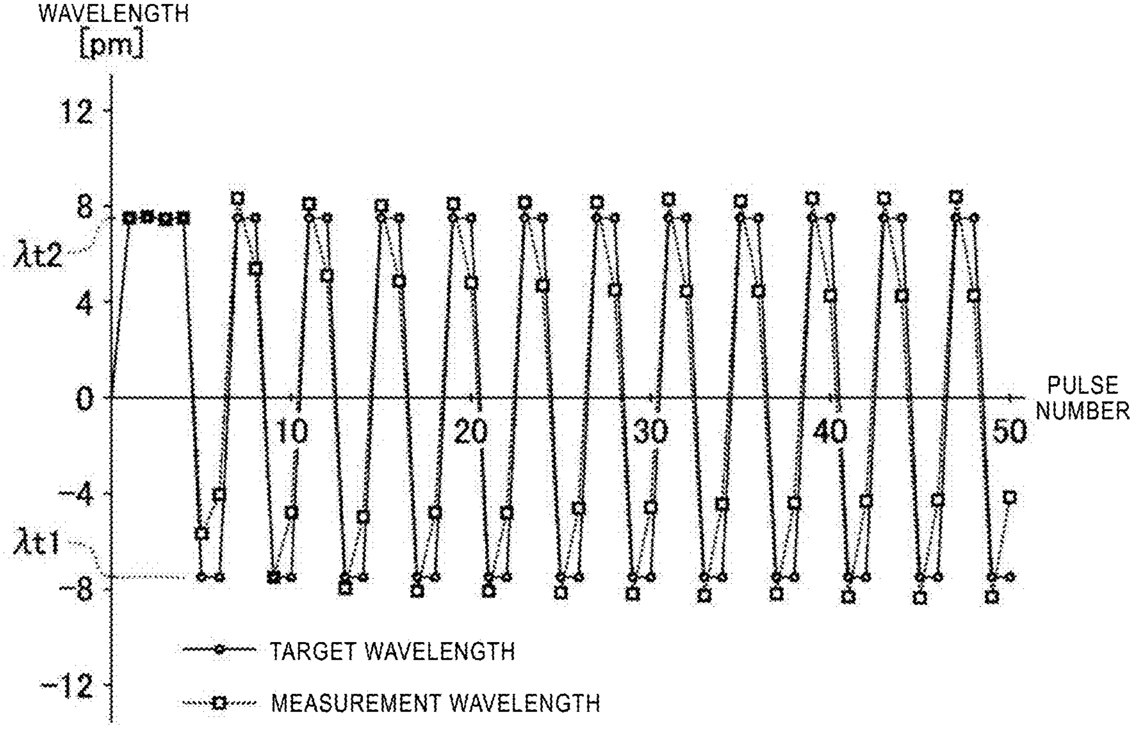
FIG. 13 is a graph showing a second example of the relationship between the target wavelength and the measurement wavelength in the first embodiment.

FIG. 13 is a graph showing a second example of the relationship between the target wavelength and the measurement wavelength in the first embodiment. The difference between the target wavelengths λt1 and λt2 is 2 μm in the first example shown in FIG. 10, whereas it is about 15 μm in the second example shown in FIG. 13. In the first example, the measurement wavelength sufficiently follows the target wavelength, but in the second example, since the difference between the target wavelengths λt1 and λt2 is large, the measurement wavelength may not sufficiently follow the target wavelength.

Figure 14:
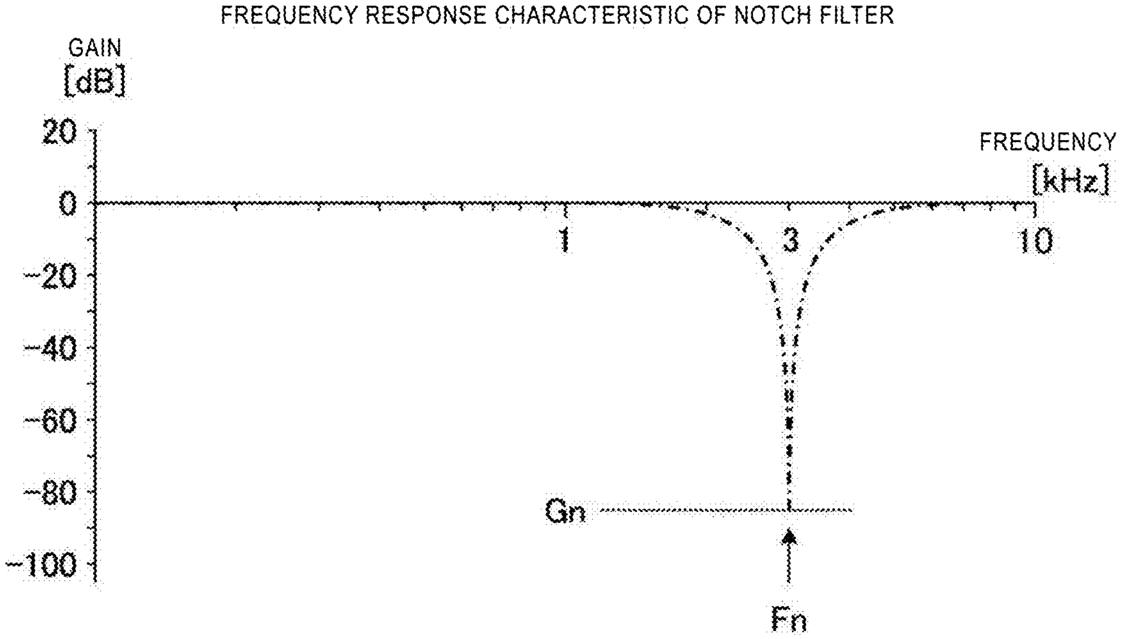
FIG. 14 is a graph showing the frequency response characteristic of the fixed notch filter of the second embodiment.

FIG. 14 is a graph showing the frequency response characteristic of the fixed notch filter 18*b* of the second embodiment. In the second embodiment, since the first and second bandpass filters 181, 182 similar to the fixed notch filter 18*a* are connected in series, the notch gain depth Gn is larger than that in the first embodiment.

Figure 15:
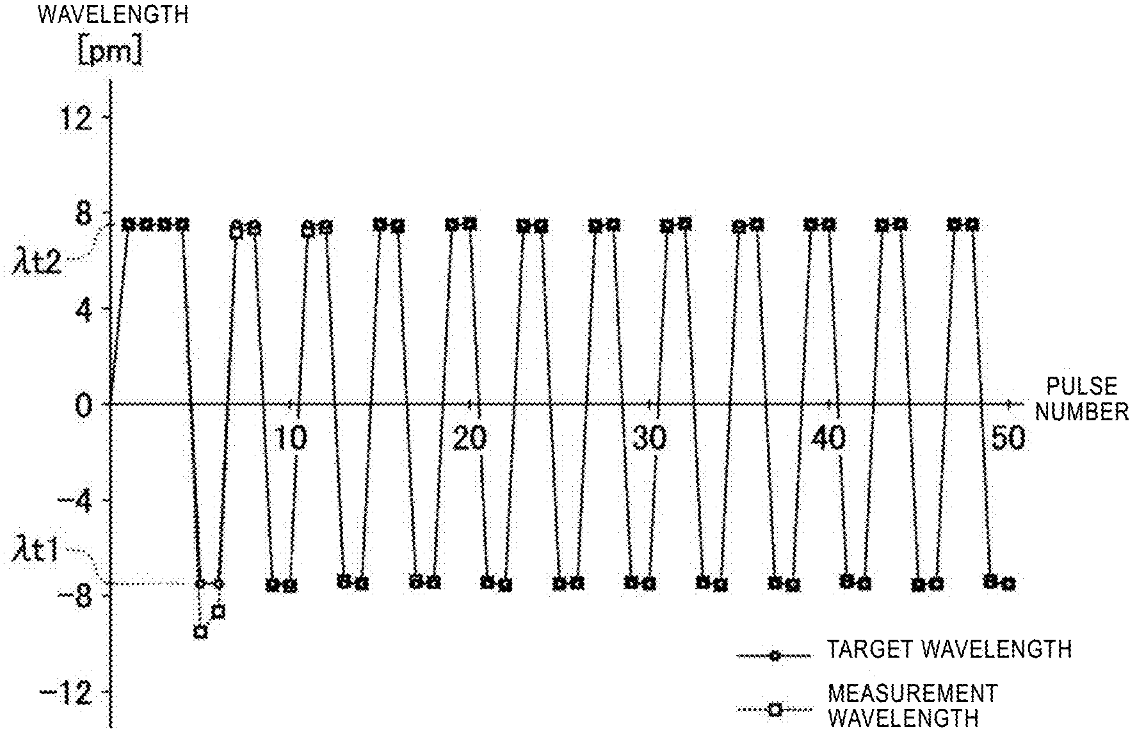
FIG. 15 is a graph showing an example of the relationship between the target wavelength and the measurement wavelength in the second embodiment.

FIG. 15 is a graph showing an example of the relationship between the target wavelength and the measurement wavelength in the second embodiment. The difference between the target wavelengths λt1 and λt2 is about 15 μm as in FIG. 13. In FIG. 13, there is a case in which the measurement wavelength cannot sufficiently follow the target wavelength, but in FIG. 15, the measurement wavelength does not largely deviate from the target wavelength, and the measurement wavelength follows well the change of the target wavelength.

3.3 Effect (5) According to the second embodiment, the fixed notch filter 18*b* includes first and second bandpass filters 181, 182 connected in series.

Accordingly, the notch gain depth Gn can be increased by configuring the fixed notch filter 18*b* with bandpass filters in a plurality of stages including the first and second bandpass filters 181, 182.

(6) According to the second embodiment, the first and second bandpass filters 181, 182 operate at the same notch frequency Fn.

Accordingly, the notch gain depth Gn at the notch frequency Fn can be increased by causing the first and second bandpass filters 181, 182 to have the same notch frequency Fn. The same notch frequency Fn is intended to allow a difference to the extent that the effect of increasing the notch gain depth Gn is not lost.

(7) According to the second embodiment, the first and second bandpass filters 181, 182 operate at the same notch gain depth Gn.

Accordingly, the manufacturing cost of the circuit can be reduced by unifying the characteristics of the semiconductor elements configuring the first and second bandpass filters 181, 182. The same notch gain depth Gn is intended to allow a difference to the extent that the effect of reducing the manufacturing cost of the circuit is not lost, and the scope of manufacturing error is included in the term of "same."

In other respects, the second embodiment is similar to the first embodiment.

4. Line Narrowing Laser Device 100*c* Including Variable Notch Filter 18*c*

4.1 Configuration

Figure 16:
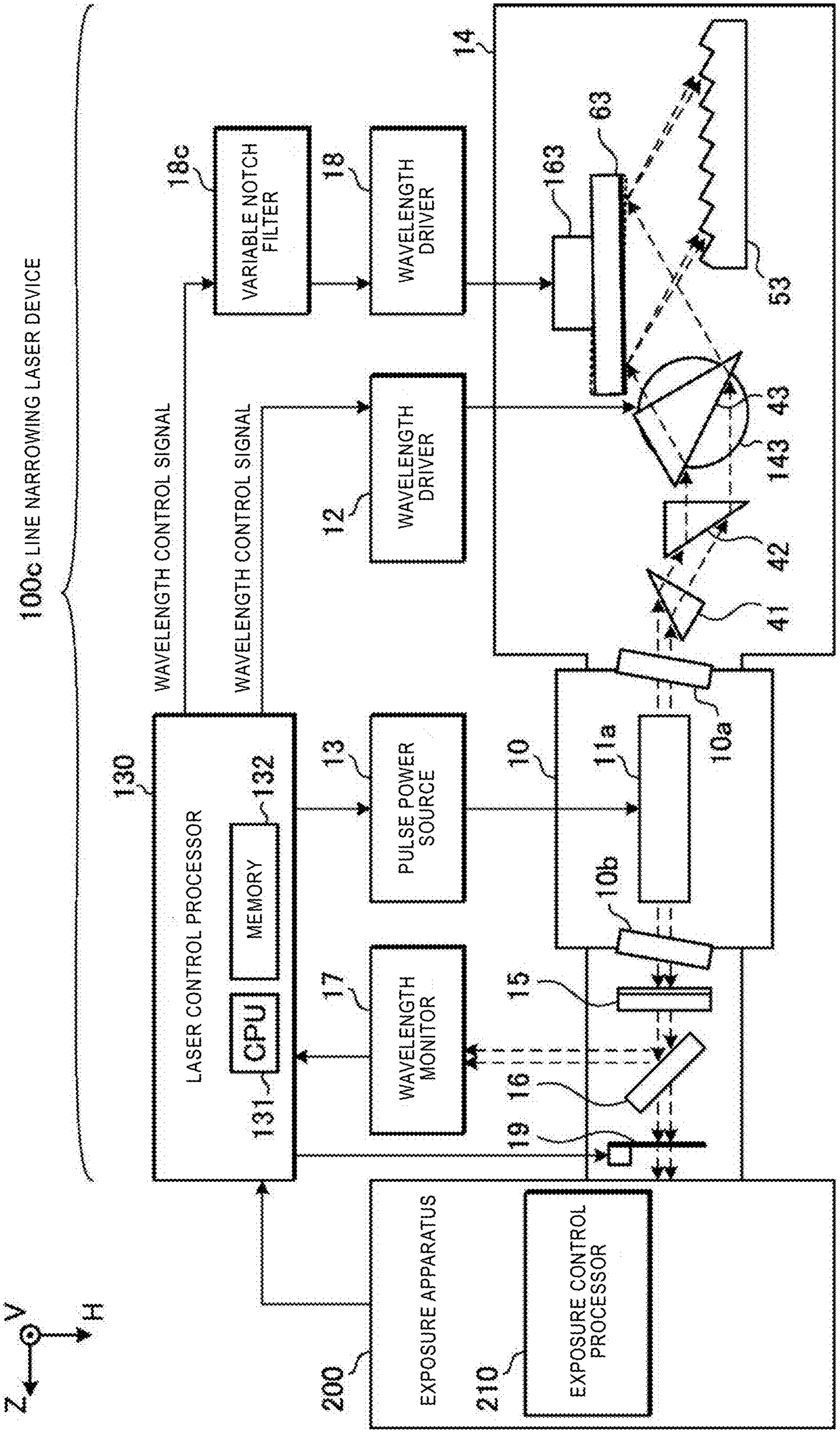
FIG. 16 schematically shows the configuration of the line narrowing laser device of a third embodiment.

FIG. 16 schematically shows the configuration of a line narrowing laser device 100*c* of a third embodiment. In the third embodiment, a variable notch filter 18*c* is arranged in the path of the wavelength control signal between the laser control processor 130 and the wavelength driver 18. The variable notch filter 18*c* is an example of the notch filter in the present disclosure.

Figure 17:
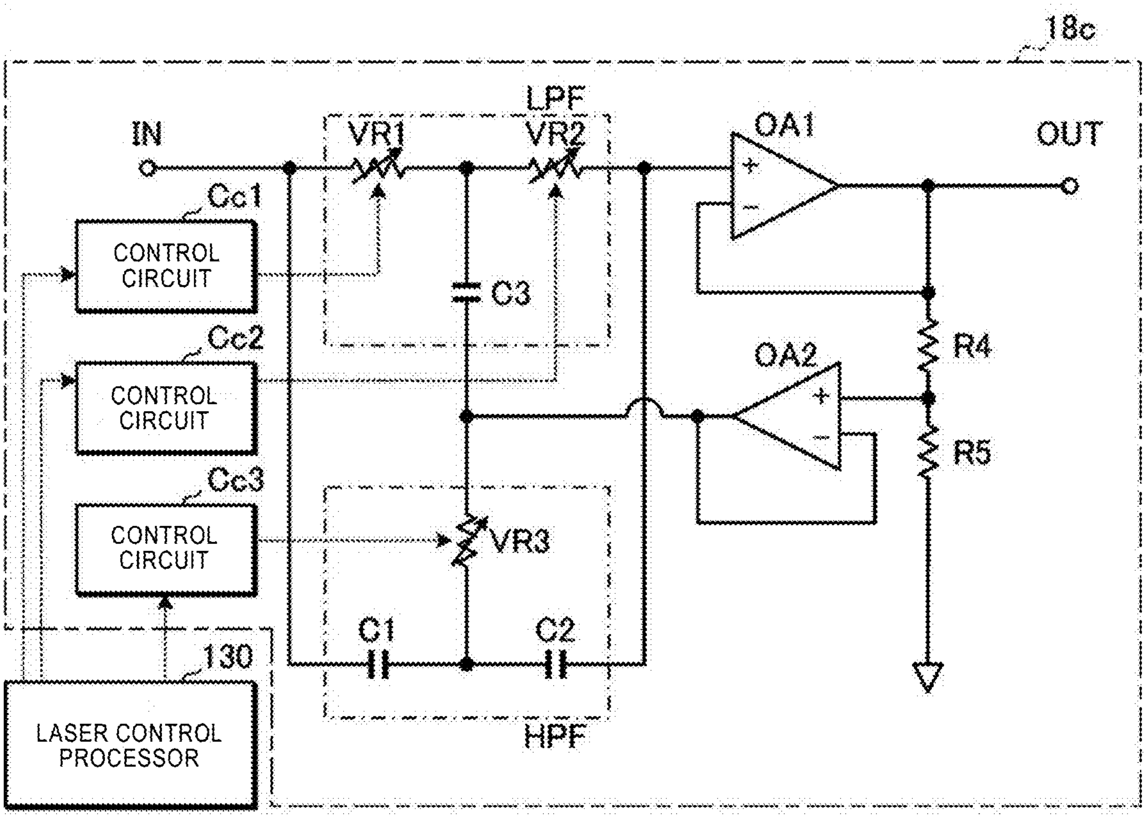
FIG. 17 is a circuit diagram showing an example of a variable notch filter included in the third embodiment.

FIG. 17 is a circuit diagram showing an example of the variable notch filter 18*c* included in the third embodiment.

The variable notch filter 18*c* includes variable resistors VR1, VR2, VR3 in place of the resistive elements R1, R2, R3, respectively. Control circuits Cc1, Cc2, Cc3 are connected the variable resistors VR1, VR2, VR3, respectively. The control circuits Cc1, Cc2, Cc3 change the resistance values $R_1$, $R_2$, $R_3$ of the variable resistors VR1, VR2, VR3, respectively, based on the control signal output from the laser control processor 130. For example, the resistance values $R_1$, $R_2$, $R_3$ are changed while maintaining the relationship of $R_1=R_2=2R_3$. Thus, the notch frequency Fn given by $1/(2\pi C_1R_1)$ can be changed.

In other respects, the variable notch filter 18*c* is similar to the fixed notch filter 18*a*.

Figure 18:
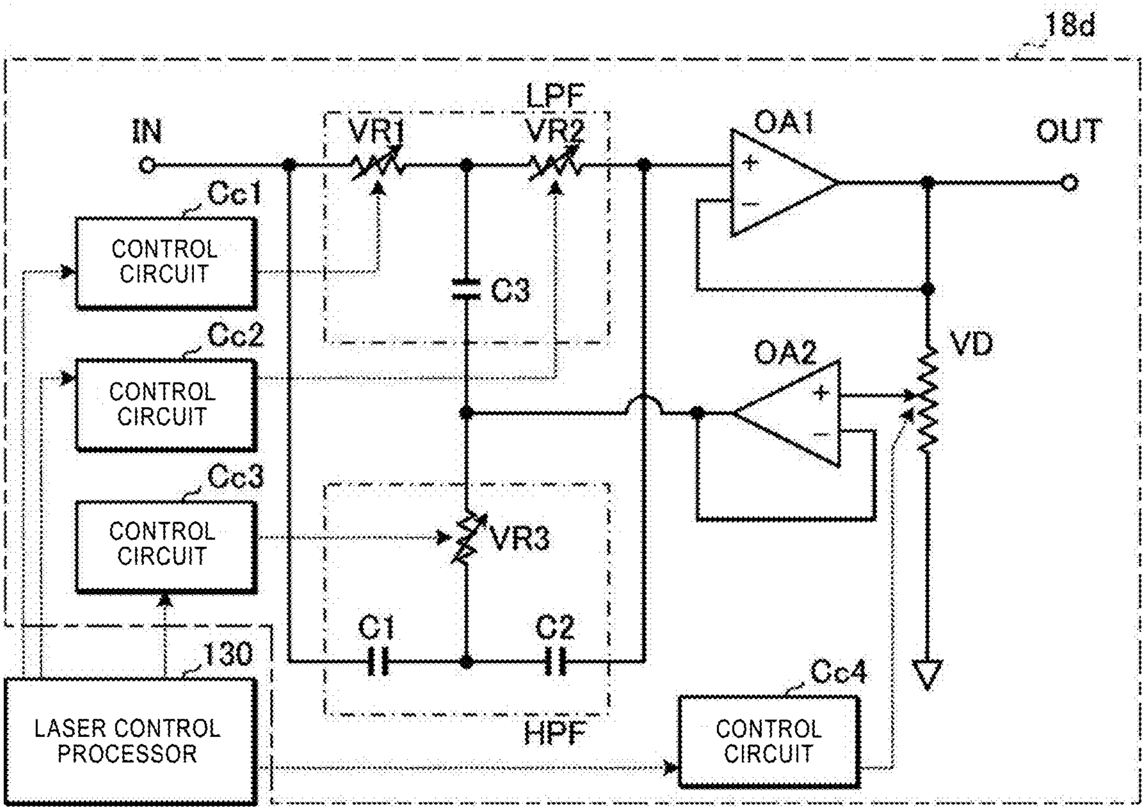
FIG. 18 is a circuit diagram showing an example of the variable notch filter included in the third embodiment.

FIG. 18 is a circuit diagram showing an example of a variable notch filter 18*d* included in the third embodiment. The variable notch filter 18*d* differs from the variable notch filter 18*c* shown in FIG. 17 in the following points, and may be used in the line narrowing laser device 100*c* in place of the variable notch filter 18*c*.

The variable notch filter 18*d* includes a variable voltage divider VD in place of the resistive elements R4, R5. The variable voltage divider VD is connected to a control circuit Cc4. The control circuit Cc4 changes the voltage division ratio of the variable voltage divider VD based on the control signal output from the laser control processor 130. By changing the voltage division ratio of the variable voltage divider VD, the feedback ratio by the operational amplifier OA2 can be changed, and the notch gain depth Gn of the variable notch filter 18*d* can be changed.

When the notch frequency Fn of the variable notch filter 18*d* is changed by changing the resistance values R1, Re, R3 of the variable resistors VR1, VR2, VR3, the phase characteristic of the variable notch filter 18*d* may be changed. When the notch frequency Fn is changed, the notch gain depth Gn may be adjusted to further adjust the phase characteristic.

On the other hand, even when the notch gain depth Gn is changed by changing the voltage division ratio of the variable voltage divider VD, the notch frequency Fn does not change significantly. Therefore, as will be described later with reference to FIGS. 21 and 24, after the notch frequency Fn is adjusted to an appropriate value, the notch gain depth Gn may be adjusted while maintaining the notch frequency Fn.

In other respects, the variable notch filter 18*d* is similar to the variable notch filter 18*c*.

4.2 Operation

Figure 19:
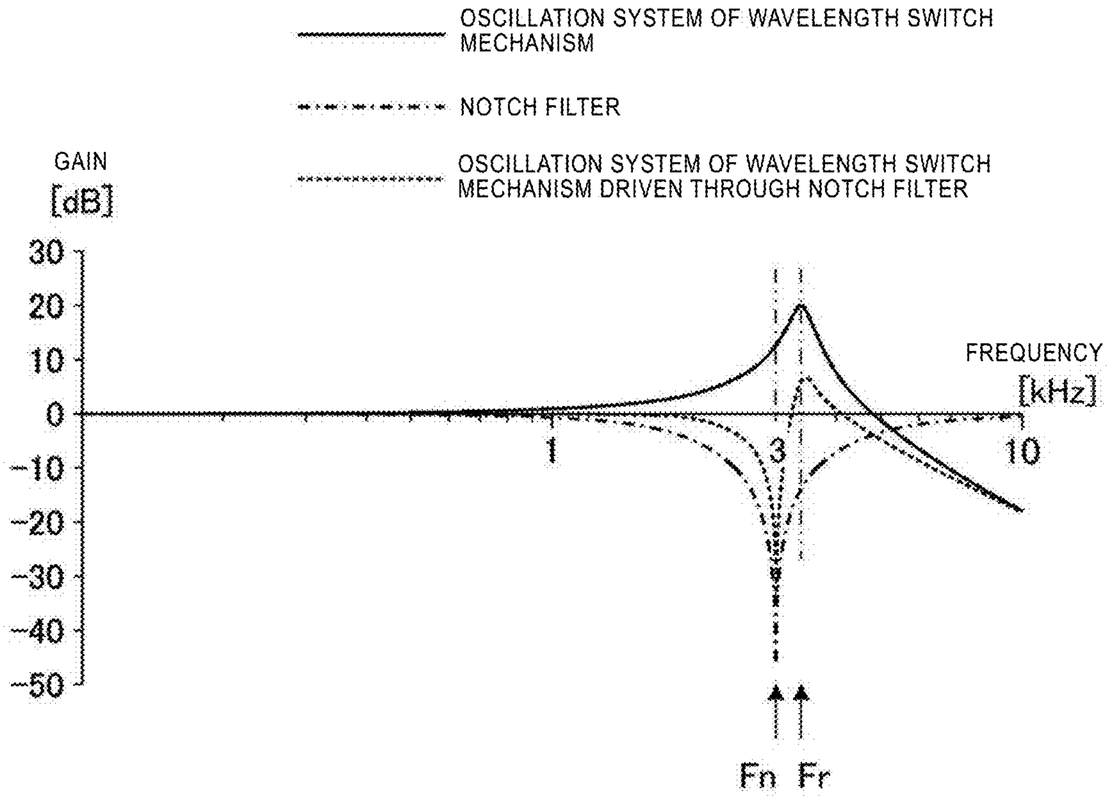
FIG. 19 is a graph showing the frequency response characteristics of the oscillation system of the wavelength switch mechanism and the variable notch filter of the third embodiment.

FIG. 19 is a graph showing the frequency response characteristics of the oscillation system of the wavelength switch mechanism and the variable notch filter 18*c* of the third embodiment.

The frequency response characteristic of the oscillation system of the wavelength switch mechanism may change due to a temperature change of an optical element, a mechanical component, and the like. For example, the resonant frequency Fr of the oscillation system of the wavelength switch mechanism may be about 3.2 kHz as shown in FIG. 19, while it is 3 kHz in FIG. 9. In such a case, the components of the wavelength control signal at the resonant frequency Fr may not be sufficiently attenuated when the notch frequency Fn remains at 3 kHz.

Figure 20:
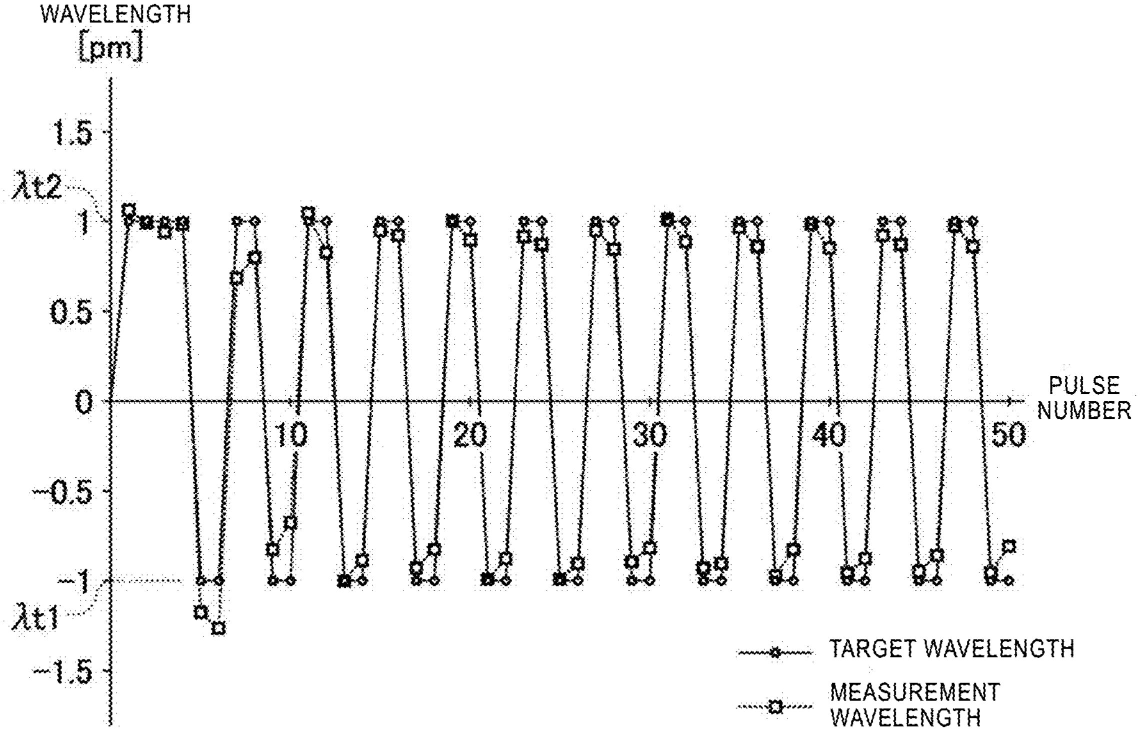
FIG. 20 is a graph showing an example of the relationship between the target wavelength and the measurement wavelength in the third embodiment.

FIG. 20 is a graph showing an example of the relationship between the target wavelength and the measurement wavelength in the third embodiment. In FIG. 10, the measurement wavelength sufficiently follows the target wavelength, but in FIG. 20, the measurement wavelength may not sufficiently follow the target wavelength due to a change in the frequency response characteristic of the oscillation system of the wavelength switch mechanism.

Therefore, the notch frequency Fn of the variable notch filter 18*c* is adjusted, or the notch frequency Fn and the notch gain depth Gn of the variable notch filter 18*d* are adjusted, so that the measurement wavelength can sufficiently follow the target wavelength.

4.2.1 Adjustment of Notch Parameters Based on Deviations Dλ1, Dλ2 Between Measurement Wavelengths λc1, λc2 and Target Wavelengths λt1, λt2

Figure 21:
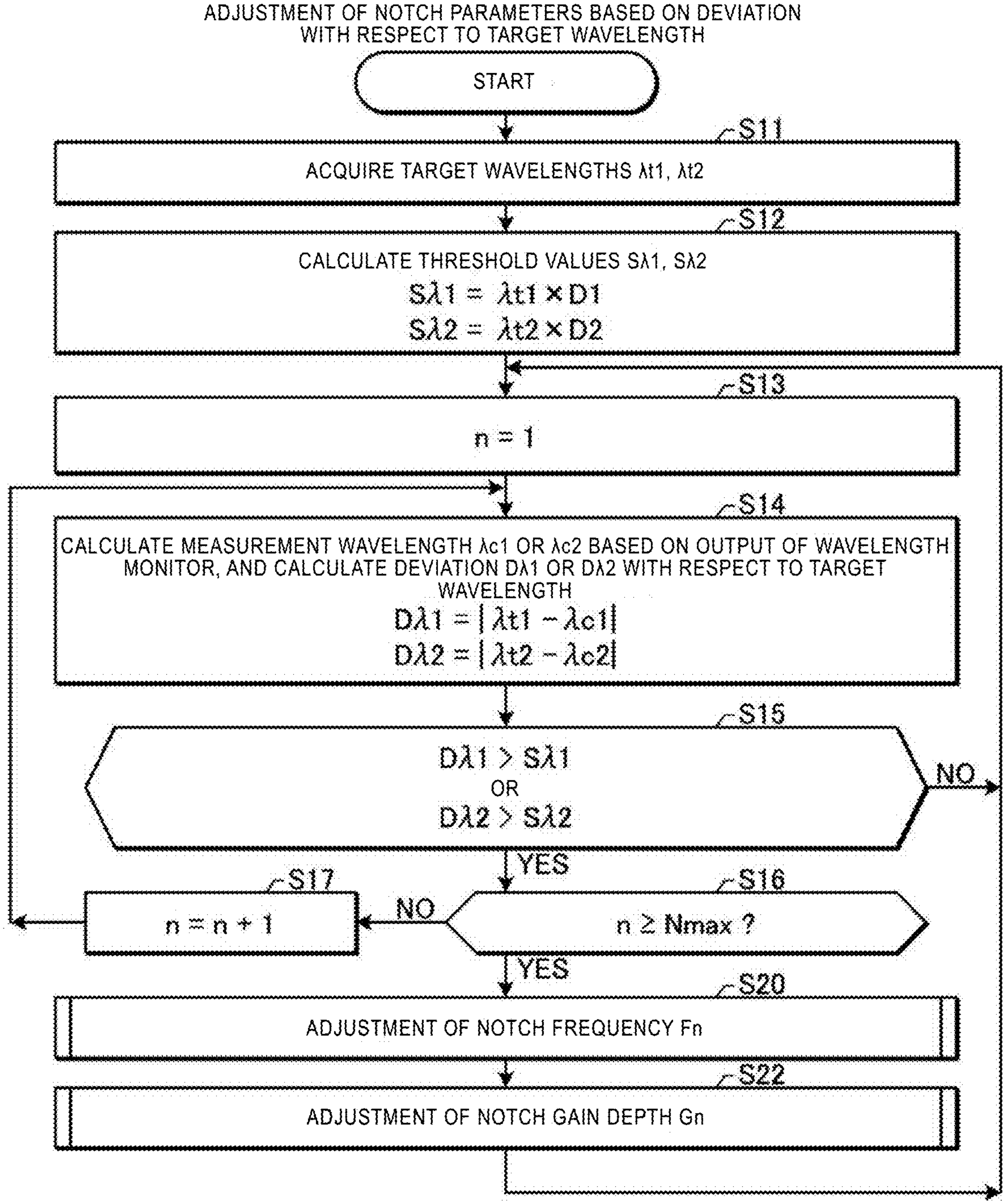
FIG. 21 is a flowchart showing a first example of adjustment of notch parameters in the third embodiment.

FIG. 21 is a flowchart showing a first example of adjustment of notch parameters in the third embodiment. The notch parameters include the notch frequency Fn and the notch gain depth Gn. Alternatively, only the notch frequency Fn may be included. In FIG. 21, whether or not to adjust the notch parameters is determined based on whether or not the deviation Dλ1 between the measurement wavelength λc1 and the target wavelength λt1 and the deviation Dλ2 between the measurement wavelength λc2 and the target wavelength λt2 are larger than corresponding threshold values Sλ1, Sλ2 over Nmax consecutive pulses. Nmax is an integer equal to or larger than 2. For example, Nmax may be equal to or larger than 30 and equal to or smaller than 60.

In S11, the laser control processor 130 acquires the target wavelengths λt1, λt2. The target wavelengths λt1, λt2 may be received from the exposure control processor 210.

In S12, the laser control processor 130 calculates the threshold values Sλ1, Sλ2 by the following expressions.

$$S\lambda 1 = \lambda t1 \times D1$$

$$S\lambda 2 = \lambda t2 \times D2$$

The threshold values Sλ1, Sλ2 are obtained by multiplying the target wavelengths λt1, λt2 by constants D1, D2 larger than 0, respectively. The constants D1, D2 are, for example, 0.05.

In S13, the laser control processor 130 sets the value of a counter n to an initial value of 1.

In S14, the laser control processor 130 calculates the measurement wavelength λc1 or λc2 based on the output of the wavelength monitor 17, and calculates the deviation Dλ1 or Dλ2 with respect to the target wavelength λt1 or λt2 by the following expression.

$$D\lambda 1 = |\lambda t1 - \lambda c1|$$

$$D\lambda 2 = |\lambda t2 - \lambda c2|$$

When the line narrowing module 14 is controlled in accordance with the target wavelength λt1, the measurement wavelength λc1 is calculated, and when the line narrowing module 14 is controlled in accordance with the target wavelength λt2, the measurement wavelength λc2 is calculated.

In S15, the laser control processor 130 determines whether or not the deviation Dλ1 or Dλ2 is larger than the corresponding threshold value Sλ1 or Sλ2. When the deviation Dλ1 is larger than the threshold value SλL or the deviation Dλ2 is larger than the threshold value Sλ2 (S15: YES), the laser control processor 130 advances processing to S16. When the deviation Dλ1 is equal to or smaller than the threshold value Sλ1 or the deviation Dλ2 is equal to or smaller than the threshold value Sλ2 (S15: NO), the laser control processor 130 returns processing to S13.

In S16, the laser control processor 130 determines whether or not the value of the counter n is equal to or larger than Nmax. When the value of the counter n is equal to or larger than Nmax (S16: YES), the laser control processor 130 advances processing to S20. When the value of the counter n is smaller than Nmax (S16: NO), the laser control processor 130 advances processing to S17.

In S17, the laser control processor 130 updates the value of the counter n by adding 1 to the value of n. After S17, the laser control processor 130 returns processing to S14 and calculates the deviation Dλ1 or Dλ2 between the measurement wavelength λc1 or λc2 and the target wavelength λt1 or λt2 of the subsequent pulse.

When the deviation Dλ1 or Dλ2 is larger than the corresponding threshold value SλL or Sλ2 (S15: YES), the processes of S14 and S15 are repeated until the value of the counter n reaches Nmax to determine whether or not the deviations Dλ1, Dλ2 are larger than the corresponding threshold value Sλ1, Sλ2 over Nmax consecutive pulses.

When the deviation Dλ1 is equal to or smaller than the threshold value SλL or the deviation Dλ2 is equal to or smaller than the threshold value Sλ2 (S15: NO), processing returns to S13, so that the counter n is counted again from 1 when the continuation of the state in which the deviations Dλ1, Dλ2 are larger than the corresponding threshold value Sλ1, Sλ2 is interrupted.

In S20, the laser control processor 130 adjusts the notch frequency Fn by outputting a control signal to the control circuits Cc1 to Cc3 shown in FIG. 17 or 18. Details of S20 will be described later with reference to FIG. 22.

In S22, the laser control processor 130 adjusts the notch gain depth Gn by outputting a control signal to the control circuit Cc4 shown in FIG. 18. Details of S22 will be described later with reference to FIG. 23.

During a period in which S20 and S22 are performed, the laser control processor 130 may set the shutter 19 to the second state so as to suppress passage of the pulse laser light to the exposure apparatus 200.

After S22, the laser control processor 130 returns processing to S13.

4.2.1.1 Adjustment of Notch Frequency Fn

Figure 22:
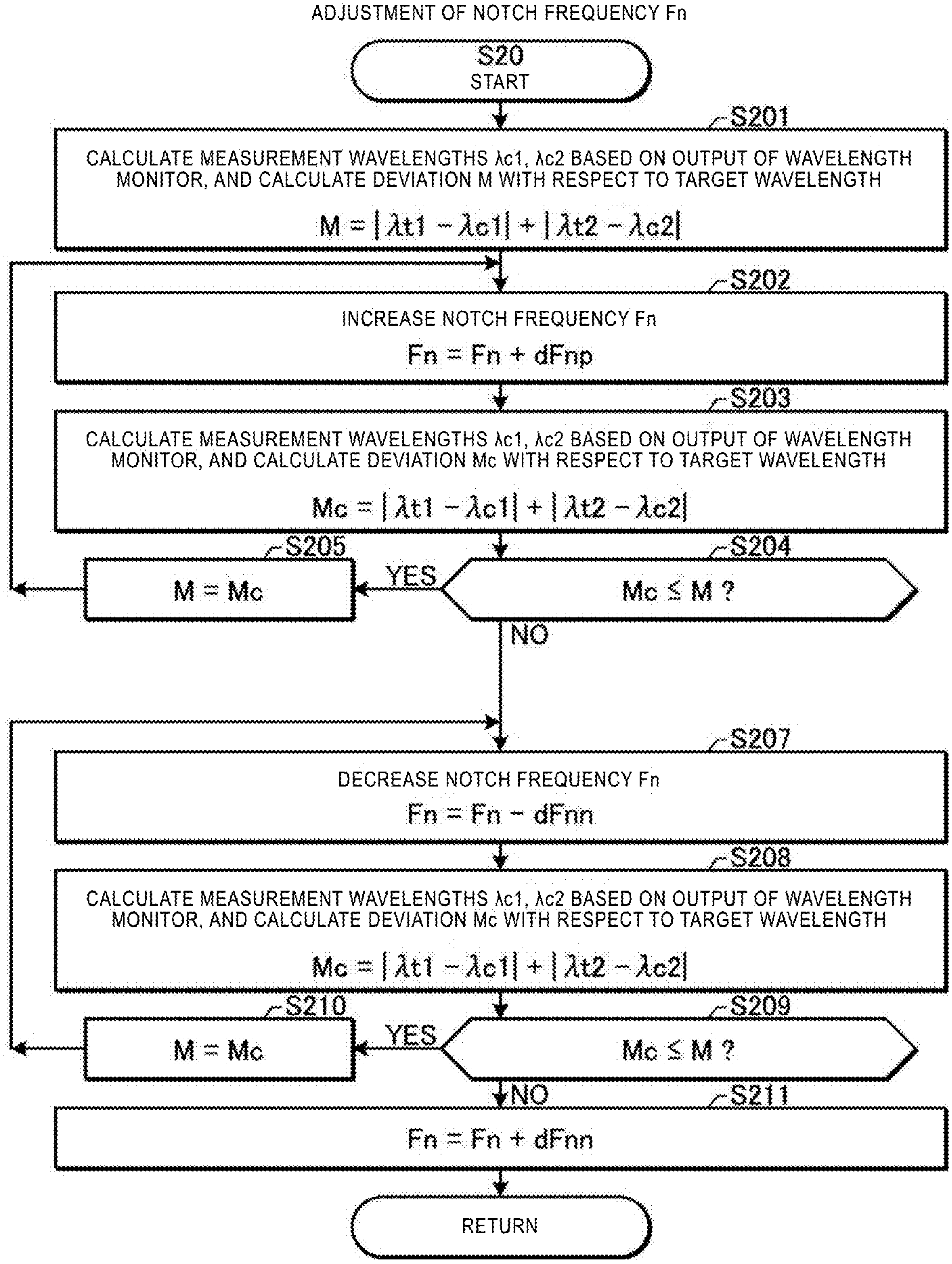
FIG. 22 is a flowchart showing an example of adjustment of a notch frequency in the third embodiment.

FIG. 22 is a flowchart showing an example of adjustment of the notch frequency Fn in the third embodiment. The processes shown in FIG. 22 correspond to the subroutine of S20 of FIG. 21. When the deviations Dλ1, Dλ2 between the measurement wavelengths λc1, λc2 and the target wavelengths λt1, λt2 are larger than the corresponding threshold value Sλ1, Sλ2 over Nmax consecutive pulses (S16: YES), the following processes are performed.

In S201, the laser control processor 130 calculates the measurement wavelengths λc1, λc2 based on a new output of the wavelength monitor 17, and calculates a deviation M with respect to the target wavelengths λt1, λt2 by the following expression.

$$M = |\lambda t1 - \lambda c1| + |\lambda t2 - \lambda c2|$$

The deviation M is a reference for changing the notch frequency Fn to search for an appropriate notch frequency Fn.

In S202, the laser control processor 130 increases the notch frequency Fn by the following expression.

$$Fn = Fn + dFnp$$

Here, dFnp represents a variation amount of the notch frequency Fn when the notch frequency Fn is increased once. For example, dFnp is equal to or larger than 1 Hz and equal to or smaller than 10 Hz.

In S203, the laser control processor 130 calculates the measurement wavelengths λc1, λc2 based on the new output of the wavelength monitor 17, and calculates a deviation Mc with respect to the target wavelengths λt1, λt2 by the following expression.

$$Mc = |\lambda t1 - \lambda c1| + |\lambda t2 - \lambda c2|$$

In S204, the laser control processor 130 determines whether or not the deviation Mc is equal to or smaller than the reference deviation M. When the deviation Mc is equal to or smaller than the deviation M (S204: YES), the laser control processor 130 advances processing to S205.

In S205, the laser control processor 130 sets the value of the deviation Mc calculated in S203 as the deviation M to be the reference thereafter. After S205, the laser control processor 130 returns processing to S202.

As described above, when the deviation Mc decreases or does not change with increase of the notch frequency Fn (S204: YES), the notch frequency Fn can be further increased to adjust the notch frequency Fn until the deviation Mc becomes a minimum value.

When the deviation Mc is increased by increasing the notch frequency Fn (S204: NO), processing advances to S207 without further increasing the notch frequency Fn.

In S207, the laser control processor 130 decreases the notch frequency Fn by the following expression.

$$Fn = Fn - dFnn$$

Here, dFnn represents a variation amount of the notch frequency Fn when the notch frequency Fn is decreased once. Further, dFnn may be the same as dFnp.

The processes of S208 to S210 are similar to the processes of S203 to S205, respectively.

When the deviation Mc decreases or does not change with decrease of the notch frequency Fn (S209: YES), the notch frequency Fn can be further decreased to adjust the notch frequency Fn until the deviation Mc becomes a minimum value.

When the deviation Mc is increased by decreasing the notch frequency Fn (S209: NO), processing advances to S211 without further decreasing the notch frequency Fn.

In S211, the laser control processor 130 increases the notch frequency Fn by the following expression.

$$Fn = Fn + dFnn$$

Since the process of S211 is performed when the deviation Mc is increased by decreasing the notch frequency Fn in S207, the notch frequency Fn can be adjusted to an optimum value by canceling the process of S207 for one time.

After S211, the laser control processor 130 ends processing of the present flowchart and returns to processing shown in FIG. 21.

As described above, the laser control processor 130 calculates the deviation Mc while increasing or decreasing the notch frequency Fn, and searches for the notch frequency Fn at which the deviation Mc approaches 0.

4.2.1.2 Adjustment of Notch Gain Depth Gn

Figure 23:
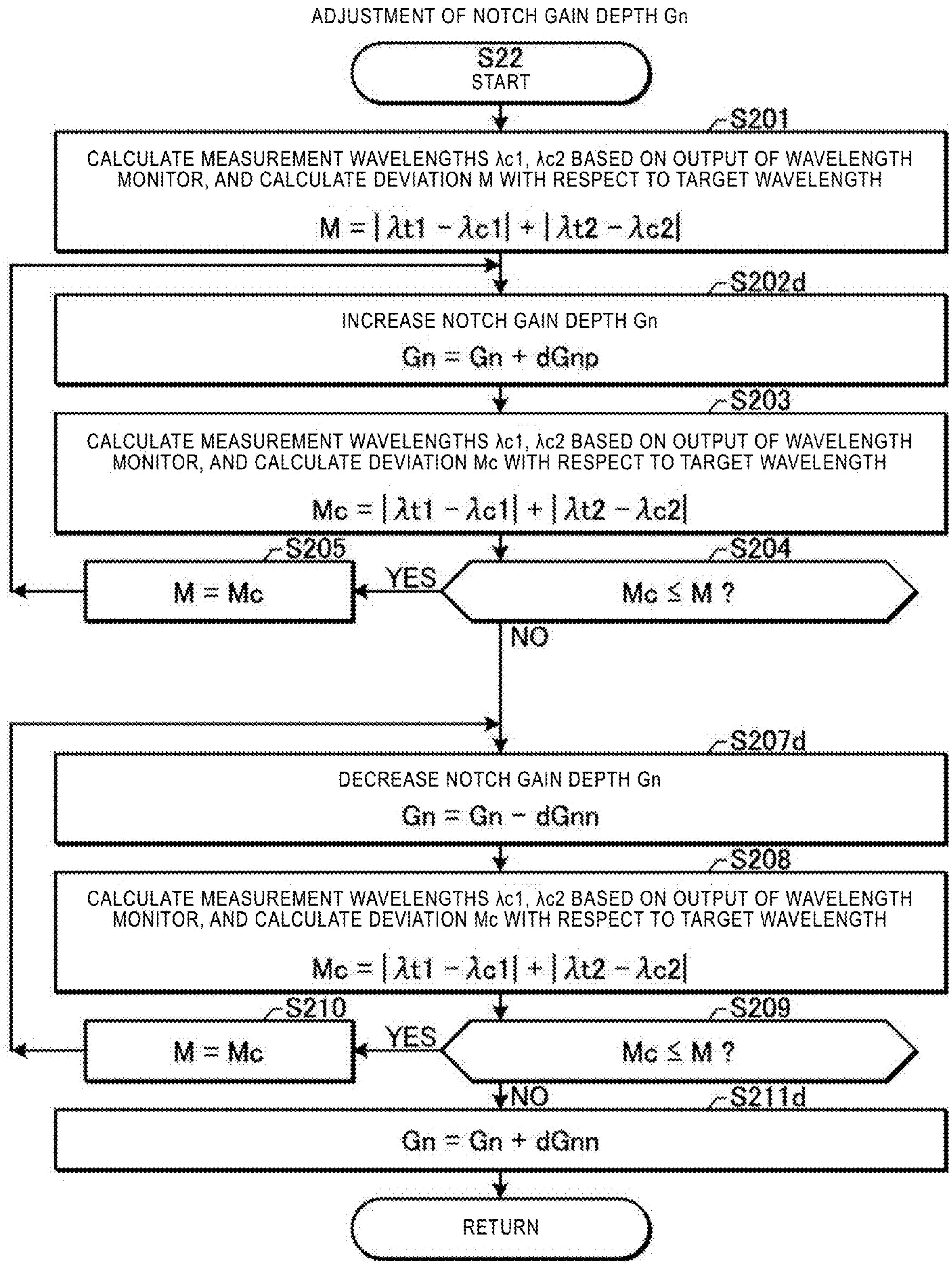
FIG. 23 is a flowchart showing an example of adjustment of a notch gain depth in the third embodiment.

FIG. 23 is a flowchart showing an example of adjustment of the notch gain depth Gn in the third embodiment. The processes shown in FIG. 23 correspond to the subroutine of S22 of FIG. 21. After adjustment of the notch frequency Fn (S20), the following processes are performed.

FIG. 23 differs from FIG. 22 in that processes of S202*d*, S207*d*, and S211*d* are performed in place of S202, S207, and S211 in FIG. 22.

In S202*d*, the laser control processor 130 increases the notch gain depth Gn by the following expression.

$$Gn = Gn + dGnp$$

Here, dGnp represents a variation amount of the notch gain depth Gn when the notch gain depth Gn is increased once. For example, dGnp is equal to or larger than 1 dB and equal to or smaller than 10 dB.

In S207*d*, the laser control processor 130 decreases the notch gain depth Gn by the following expression.

$$Gn = Gn - dGnn$$

Here, dGnn represents a variation amount of the notch gain depth Gn when the notch gain depth Gn is decreased once. Further, dGnn may be the same as dGnp.

In S211*d*, the laser control processor 130 increases the notch gain depth Gn by the following expression.

$$Gn = Gn + dGnn$$

The notch gain depth Gn can be adjusted to an optimum value by canceling the process of S207*d* for one time.

As described above, the laser control processor 130 calculates the deviation Mc while increasing or decreasing the notch gain depth Gn, and searches for the notch gain depth Gn at which the deviation Mc approaches 0.

In other respects, the processes shown in FIG. 23 are similar to those of FIG. 22.

4.2.2 Adjustment of Notch Parameters Based on Wavelength Difference Between Measurement Wavelengths λt1 and λt2

Figure 24:
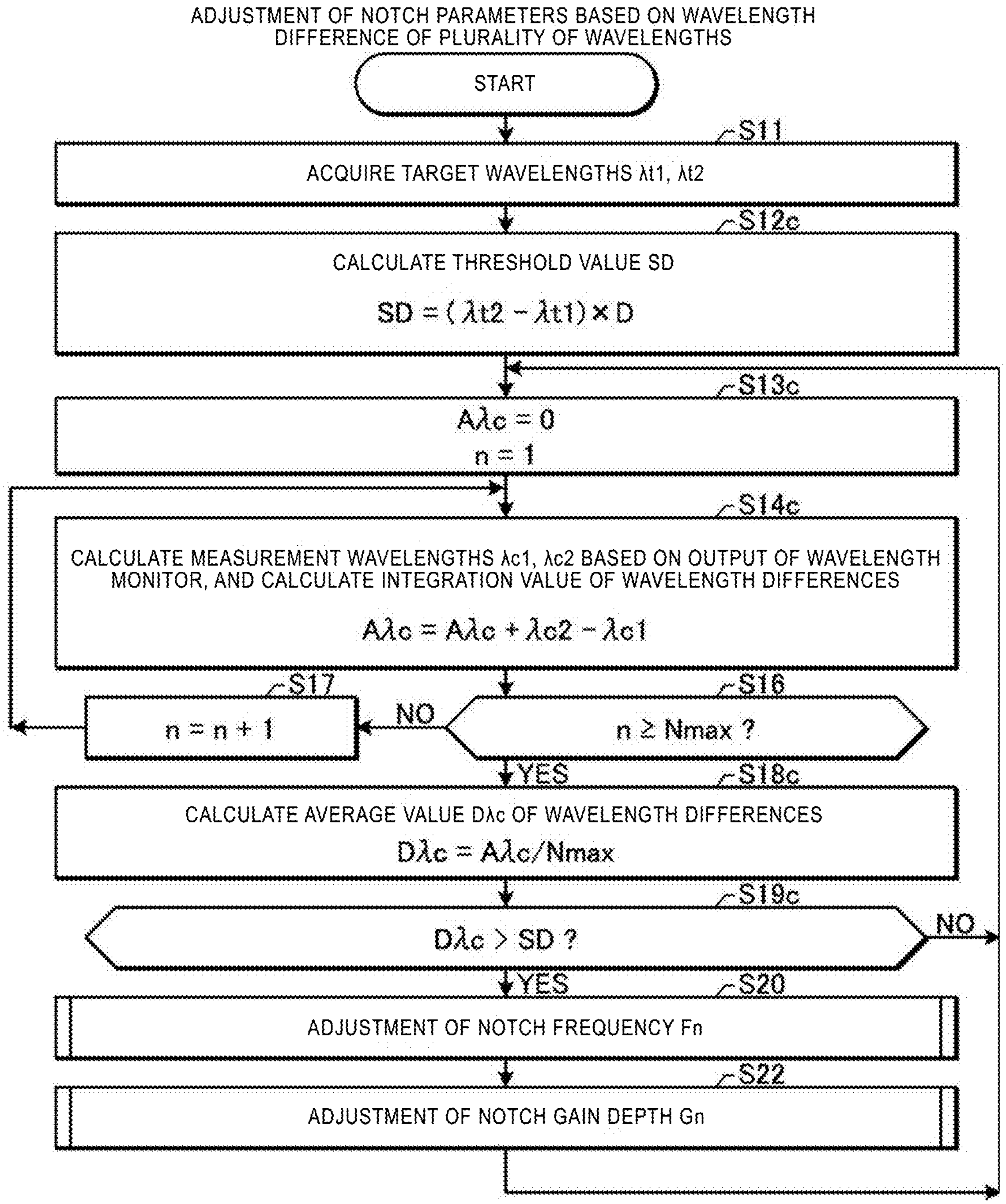
FIG. 24 is a flowchart showing a second example of adjustment of the notch parameters in the third embodiment.

FIG. 24 is a flowchart showing a second example of adjustment of notch parameters in the third embodiment. In FIG. 24, whether or not to adjust the notch parameters is determined by calculating the wavelength difference between the measurement wavelengths λc1 and λc2 Nmax times, and determining whether or not an average value Dλc thereof is larger than a threshold value SD.

The process of S11 is similar to that described with reference to FIG. 21.

In S12*c*, the laser control processor 130 calculates the threshold value SD by the following expression.

$$SD = (\lambda t2 - \lambda t1) \times D$$

The threshold value SD is obtained by multiplying the difference between the target wavelengths λt1, λt2 by a constant D larger than 1. The constant D is, for example, 1.05.

In S13*c*, the laser control processor 130 sets an integration value Aλc of the wavelength difference to an initial value of 0, and sets the value of the counter n to an initial value of 1.

In S14*c*, the laser control processor 130 calculates the measurement wavelengths λc1, λc2 of two pulses having different target wavelengths based on the output of the wavelength monitor 17, and calculates the integration value Aλc of the wavelength difference between the measurement wavelengths λc1 and λc2 by the following expression.

$$A\lambda c = A\lambda c + \lambda c2 - \lambda c1$$

In S16, the laser control processor 130 determines whether or not the value of the counter n is equal to or larger than Nmax. When the value of the counter n is equal to or larger than Nmax (S16: YES), the laser control processor 130 advances processing to S18*c*. When the value of the counter n is smaller than Nmax (S16: NO), the laser control processor 130 advances processing to S17.

In S17, the laser control processor 130 updates the value of the counter n by adding 1 to the value of n. After S17, the laser control processor 130 returns processing to S14*c* and adds, to the integration value Aλc, the wavelength difference λc2–λc1 between the measurement wavelengths λc1 and λc2 of the subsequent two pulses having different target wavelengths.

In S18*c*, the laser control processor 130 calculates the average value Dλc of the wavelength differences by the following expression using the integration value Aλc obtained by integrating the wavelength differences λc2–λc1 calculated Nmax times.

$$D\lambda c = A\lambda c / N\max$$

In S19*c*, the laser control processor 130 determines whether or not the average value Dλc of the wavelength differences is larger than the threshold value SD. When the average value Dλc of the wavelength differences is larger than the threshold value SD (S19*c*: YES), the laser control processor 130 advances processing to S20. When the average value Dλc of the wavelength differences is equal to or smaller than the threshold value SD (S19*c*: NO), the laser control processor 130 returns processing to S13*c*.

The processes of S20 and S22 are similar to those described with reference to FIGS. 21 to 23.

In FIG. 24, the notch parameters are adjusted when the average value Dλc of the wavelength differences is larger than the threshold value SD, whereas in FIGS. 22 and 23, the notch parameters are adjusted without considering the average value Dλc of the wavelength differences. By performing processes of S13*c* to S19*c* after the notch parameters are adjusted, it can be checked whether or not the notch parameters are appropriately adjusted.

Alternatively, instead of calculating the deviations Dλ1, Dλ2 between the measurement wavelengths λc1, λc2 and the target wavelengths λt1, λt2 in S201, S203, S208 of FIGS. 22 and S201*d*, S203*d*, S208*d* of FIG. 23, the average value Dλc of the wavelength differences between the measurement wavelengths λc1 and λc2 may be calculated. For example, the laser control processor 130 may calculate the average value Dλc of the wavelength differences while increasing or decreasing the notch frequency Fn, and search for the notch frequency Fn at which the average value Dλc approaches a minimum value. Further, the laser control processor 130 may calculate the average value Dλc of the wavelength differences while increasing or decreasing the notch gain depth Gn, and search for the notch gain depth Gn at which the average value Dλc approaches a minimum value.

In FIG. 24, description has been provided on the case in which the average value Dλc is calculated every time the wavelength difference between the measurement wavelengths λc1 and λc2 is calculated Nmax times, but the moving average may be calculated instead of the average value Dλc. For example, every time the wavelength difference is calculated, the average value of the wavelength differences of the latest Nmax times may be calculated.

In other respects, the processes shown in FIG. 24 are similar to those of FIG. 21.

In the third embodiment, the notch parameters may be adjusted when both of the condition regarding the deviations Dλ1, Dλ2 between the measurement wavelengths λc1, λc2 and the target wavelengths λt1, λt2 shown in FIG. 21 and the condition regarding the average value Dλc of the wavelength differences between the measurement wavelengths λc1 and λc2 shown in FIG. 24 are satisfied.

4.3 Variable Notch Filter Including Bandpass Filters in Plurality of Stages

In the third embodiment, description has been provided on the case in which the variable notch filters 18*c*, 18*d* are each configured by the bandpass filter in one stage, but the present disclosure is not limited thereto. Instead of the variable notch filter 18*c* or 18*d*, a variable notch filter including first and second bandpass filters (not shown) connected in series may be used. Each of the first and second bandpass filters may be capable of adjusting the notch parameters by the laser control processor 130. The laser control processor 130 may adjust the first and second bandpass filters to operate at the same notch frequency Fn. The laser control processor 130 may adjust the first and second bandpass filters to operate at the same notch gain depth Gn.

4.4 Effect (8) According to the third embodiment, the variable notch filter 18*c* or 18*d* included in the line narrowing laser device 100*c* is configured such that the notch parameters can be adjusted by the laser control processor 130.

Accordingly, since the notch parameter can be changed, it is possible to accurately perform the periodic wavelength change corresponding to the characteristic change of the line narrowing laser device 100*c*.

(9) According to the third embodiment, the notch parameters include the notch frequency Fn and the notch gain depth Gn, and the laser control processor 130 adjusts the notch gain depth Gn after adjusting the notch frequency Fn.

Although the phase characteristic may change when the notch frequency Fn is changed, the phase characteristic can be adjusted by adjusting the notch gain depth Gn. On the other hand, the notch frequency Fn does not change significantly even when the notch gain depth Gn is changed. Therefore, it is possible to appropriately adjust the notch frequency Fn and the notch gain depth Gn by first adjusting the notch frequency Fn and then adjusting the notch gain depth Gn.

(10) According to the third embodiment, the line narrowing laser device 100*c* includes the wavelength monitor 17 positioned on the optical path of the pulse laser light, and the laser control processor 130 calculates the measurement wavelengths λc1, λc2 of the pulse laser light based on the output of the wavelength monitor 17, and adjusts the notch parameters based on the measurement wavelengths λc1, λc2.

Accordingly, it is possible to accurately perform the periodic wavelength change corresponding to the change of the measurement wavelengths λc1, λc2 caused by the characteristic change of the line narrowing laser device 100*c*.

(11) According to the third embodiment, the laser control processor 130 calculates the deviations Dλ1, Dλ2 between the measurement wavelengths λc1, λc2 and the target wavelengths λt1, λt2 of the pulse laser light, and adjusts the notch parameters based on the deviations Dλ1, Dλ2.

Accordingly, it is possible to accurately perform the periodic wavelength change corresponding to the change of the deviations Dλ1, Dλ2 caused by the characteristic change of the line narrowing laser device 100*c*.

(12) According to the third embodiment, the laser control processor 130 compares the deviation Dλ1, Dλ2 with the corresponding threshold value Sλ1, Sλ2, and adjusts the notch parameters when the deviation Dλ1, Dλ2 is larger than the corresponding threshold value Sλ1, Sλ2 over Nmax consecutive pulses.

Accordingly, when the deviations Dλ1, Dλ2 are large, the notch parameters can be adjusted to decrease the deviations Dλ1, Dλ2.

(13) According to the third embodiment, the notch parameters include the notch frequency Fn, and the laser control processor 130 calculates the deviation Mc between the measurement wavelengths λc1, λc2 and the target wavelengths λt1, λt2 while increasing or decreasing the notch frequency Fn, and searches for the notch frequency Fn at which the deviation Mc approaches 0.

Accordingly, by searching for the notch frequency Fn at which the deviation Mc approaches 0, it is possible to find the appropriate notch frequency Fn corresponding to the characteristic change of the line narrowing laser device 100*c*.

(14) According to the third embodiment, the notch parameters include the notch gain depth Gn, and the laser control processor 130 calculates the deviation Mc while increasing or decreasing the notch gain depth Gn, and searches for the notch gain depth Gn at which the deviation Mc approaches zero.

Accordingly, by searching for the notch gain depth Gn at which the deviation Mc approaches 0, it is possible to find the appropriate notch gain depth Gn corresponding to the characteristic change of the line narrowing laser device 100*c*.

(15) According to the third embodiment, the laser control processor 130 calculates the wavelength difference between the measurement wavelengths λc1 and λc2 of a plurality of pulses of the pulse laser light having different target wavelengths, and adjusts the notch parameters based on the wavelength difference.

Accordingly, it is possible to accurately perform the periodic wavelength change corresponding to the change of the wavelength difference between the measurement wavelengths λc1 and λc2 of a plurality of pulses caused by the characteristic change of the line narrowing laser device 100*c*.

(16) According to the third embodiment, the laser control processor 130 calculates the wavelength difference between the measurement wavelengths λc1 and λc2 a plurality of times to calculate the average value Dλc of the wavelength differences, and adjusts the notch parameters when the average value Dλc is larger than the threshold value SD.

Accordingly, when the average value Dλc of the wavelength differences is large, the notch parameters can be adjusted to decrease the average value Dλc of the wavelength differences.

(17) According to the third embodiment, the notch filter includes the first and second bandpass filters connected in series, and the first and second bandpass filters are each configured such that the notch parameters can be adjusted by the laser control processor 130.

Accordingly, the dynamic range of the notch parameters can be increased by connecting the first and second bandpass filters in series and setting the notch parameters to be adjustable.

(18) According to the third embodiment, the laser control processor 130 adjusts the notch parameters so that the first and second bandpass filters operate at the same notch frequency Fn.

Accordingly, the notch gain depth Gn at the notch frequency Fn can be increased by adjusting the notch parameters so that the first and second bandpass filters operate at the same notch frequency Fn.

(19) According to the third embodiment, the laser control processor 130 adjusts the notch parameters so that the first and second bandpass filters operate at the same notch gain depth Gn.

Accordingly, by setting the notch gain depth Gn to be the same, adjustment of the notch parameters can be easily performed.

In other respects, the third embodiment is similar to the first embodiment.

5. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that the embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A line narrowing laser device comprising:

an optical element and a diffractive optical element positioned on an optical path of an optical resonator;

a wavelength actuator configured to change an incident angle of light incident on the diffractive optical element by moving the optical element;

a wavelength driver configured to drive the wavelength actuator;

a processor configured to receive a plurality of target wavelengths and output a wavelength control signal to the wavelength driver so that a wavelength of pulse laser light output from the optical resonator periodically changes among the target wavelengths, thereby performing two-wavelength oscillation or multiple-wavelength oscillation; and a notch filter arranged in a path of the wavelength control signal and configured to operate at a notch frequency different from a drive frequency of the wavelength actuator.

2. The line narrowing laser device according to claim 1, wherein the notch frequency is higher than the drive frequency.

3. The line narrowing laser device according to claim 1, wherein the notch frequency is a frequency of multiplication of the drive frequency by an odd number larger than 1.

4. The line narrowing laser device according to claim 1, wherein the notch frequency is set in accordance with a resonant frequency of an oscillation system of a wavelength switch mechanism which oscillates by periodic driving of the wavelength actuator.

5. The line narrowing laser device according to claim 4, wherein the notch filter is configured such that a notch parameter can be adjusted by the processor, and the processor adjusts the notch parameter when the resonant frequency changes.

6. The line narrowing laser device according to claim 1, wherein the notch filter includes first and second bandpass filters connected in series.

7. The line narrowing laser device according to claim 6, wherein the first and second bandpass filters operate at a same notch frequency and a same notch gain depth.

8. The line narrowing laser device according to claim 1, wherein the notch filter is configured such that a notch parameter can be adjusted by the processor.

9. The line narrowing laser device according to claim 8, wherein the notch parameter includes the notch frequency and a notch gain depth, and the processor adjusts the notch gain depth after adjusting the notch frequency.

10. The line narrowing laser device according to claim 8, further comprising a wavelength monitor positioned on an optical path of the pulse laser light, wherein the processor calculates a measurement wavelength of the pulse laser light based on an output of the wavelength monitor, and adjusts the notch parameter based on the measurement wavelength.

11. The line narrowing laser device according to claim 10, wherein the processor calculates a deviation between the measurement wavelength and a target wavelength of the pulse laser light, and adjusts the notch parameter based on the deviation.

12. The line narrowing laser device according to claim 11, wherein the processor compares the deviation with a threshold value, and adjusts the notch parameter when the deviation is larger than the threshold value over predetermined consecutive pulses.

13. The line narrowing laser device according to claim 12, wherein the notch parameter includes the notch frequency, and the processor calculates the deviation while increasing or decreasing the notch frequency, and searches for the notch frequency at which the deviation approaches 0.

14. The line narrowing laser device according to claim 12, wherein the notch parameter further includes a notch gain depth, and the processor calculates the deviation while increasing or decreasing the notch gain depth, and searches for the notch gain depth at which the deviation approaches 0.

15. The line narrowing laser device according to claim 10, wherein the processor calculates a wavelength difference between the measurement wavelengths of a plurality of pulses of the pulse laser light having different target wavelengths, and adjusts the notch parameter based on the wavelength difference.

16. The line narrowing laser device according to claim 15, wherein the processor calculates the wavelength difference a plurality of times to calculate an average value of the wavelength differences, and adjusts the notch parameter when the average value is larger than a threshold value.

17. The line narrowing laser device according to claim 1, wherein the notch filter includes first and second bandpass filters connected in series, and each of the first and second bandpass filters is configured such that a notch parameter thereof can be adjusted by the processor.

18. The line narrowing laser device according to claim 17, wherein the processor adjusts the notch parameter so that the first and second bandpass filters operate at a same notch frequency.

19. The line narrowing laser device according to claim 18, wherein the processor adjusts the notch parameter so that the first and second bandpass filters operate at a same notch gain depth.

20. An electronic device manufacturing method, comprising:

generating pulse laser light using a line narrowing laser device;

outputting the pulse laser light to an exposure apparatus; and exposing a photosensitive substrate to the pulse laser light in the exposure apparatus to manufacture an electronic device, the line narrowing laser device including:

an optical element and a diffractive optical element positioned on an optical path of an optical resonator;

a wavelength actuator configured to change an incident angle of light incident on the diffractive optical element by moving the optical element;

a wavelength driver configured to drive the wavelength actuator;

a processor configured to receive a plurality of target wavelengths and output a wavelength control signal to the wavelength driver so that a wavelength of the pulse laser light output from the optical resonator periodically changes among the target wavelengths, thereby performing two-wavelength oscillation or multiple-wavelength oscillation; and a notch filter arranged in a path of the wavelength control signal and configured to operate at a notch frequency different from a drive frequency of the wavelength actuator.

* * * * *